(12) United States Patent
Okuno et al.

(10) Patent No.: US 8,476,147 B2
(45) Date of Patent: Jul. 2, 2013

(54) SOI SUBSTRATE AND MANUFACTURING METHOD THEREOF

(75) Inventors: Naoki Okuno, Kanagawa (JP); Hajime Tokunaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/017,740

(22) Filed: Jan. 31, 2011

(65) Prior Publication Data

US 2011/0186958 A1 Aug. 4, 2011

(30) Foreign Application Priority Data

Feb. 3, 2010 (JP) ................................. 2010-021857

(51) Int. Cl.
*H01L 21/762* (2006.01)
*H01L 29/02* (2006.01)

(52) U.S. Cl.
USPC .... 438/458; 438/149; 438/455; 257/E21.568; 257/E29.002

(58) Field of Classification Search
USPC .......................................... 438/149, 455, 458
See application file for complete search history.

(56) References Cited

U.S. PATENT DOCUMENTS

| | | | |
|---|---|---|---|
| 5,347,154 A | 9/1994 | Takahashi et al. | |
| 5,374,564 A | 12/1994 | Bruel | |
| 5,374,581 A | 12/1994 | Ichikawa et al. | |
| 5,670,411 A | 9/1997 | Yonehara et al. | |
| 5,695,557 A | 12/1997 | Yamagata et al. | |
| 6,093,623 A | 7/2000 | Forbes | |
| 6,107,213 A | 8/2000 | Tayanaka | |
| 6,121,117 A * | 9/2000 | Sato et al. ...................... 438/459 |
| 6,191,007 B1 | 2/2001 | Matsui et al. | |
| 6,335,231 B1 | 1/2002 | Yamazaki et al. | |
| 6,372,609 B1 | 4/2002 | Aga et al. | |
| 6,375,738 B1 | 4/2002 | Sato | |
| 6,380,019 B1 | 4/2002 | Yu et al. | |
| 6,380,046 B1 | 4/2002 | Yamazaki | |
| 6,534,380 B1 | 3/2003 | Yamauchi et al. | |
| 6,818,529 B2 | 11/2004 | Bachrach et al. | |
| 6,927,148 B2 | 8/2005 | Ito | |
| 7,148,124 B1 | 12/2006 | Usenko | |
| 2002/0109144 A1 | 8/2002 | Yamazaki | |

(Continued)

FOREIGN PATENT DOCUMENTS

| JP | 11-045862 | 2/1999 |
|---|---|---|
| JP | 11-163363 | 6/1999 |

(Continued)

*Primary Examiner* — Alexander Ghyka
(74) *Attorney, Agent, or Firm* — Nixon Peabody LLP; Jeffrey L. Costellia

(57) ABSTRACT

A bond substrate is irradiated with ions, so that an embrittlement layer is formed, then, the bond substrate is bonded to a base substrate. Next, a part of a region of the bonded bond substrate is heated at a temperature higher than a temperature of the other part of the region of the bond substrate, or alternatively, a first heat treatment is performed on the bonded bond substrate as a whole at a first temperature; and a second heat treatment is performed on a part of a region of the bonded bond substrate at a second temperature higher than the first temperature, so that separation of the bond substrate proceeds from the part of the region of the bond substrate to the other part of the region of the bond substrate in the embrittlement layer. Accordingly, a semiconductor layer is formed over the base substrate.

32 Claims, 18 Drawing Sheets

U.S. PATENT DOCUMENTS

| | | |
|---|---|---|
| 2003/0036247 A1 | 2/2003 | Eriksen et al. |
| 2003/0183876 A1 | 10/2003 | Takafuji et al. |
| 2003/0190794 A1 | 10/2003 | Ohmi et al. |
| 2005/0042798 A1 | 2/2005 | Nagao et al. |
| 2005/0048736 A1 | 3/2005 | Kerdiles et al. |
| 2006/0068563 A1 | 3/2006 | Wong et al. |
| 2007/0134891 A1 | 6/2007 | Adetutu et al. |
| 2007/0141803 A1 | 6/2007 | Boussagol et al. |
| 2007/0173000 A1 | 7/2007 | Yamazaki |
| 2007/0281440 A1 | 12/2007 | Cites et al. |
| 2008/0242051 A1 | 10/2008 | Yamazaki et al. |
| 2008/0246109 A1 | 10/2008 | Ohnuma et al. |
| 2008/0280417 A1 | 11/2008 | Yamazaki et al. |
| 2009/0098674 A1 | 4/2009 | Yamazaki et al. |
| 2009/0098690 A1 | 4/2009 | Yamazaki et al. |
| 2009/0117707 A1 | 5/2009 | Shimomura et al. |
| 2009/0137101 A1 | 5/2009 | Yamazaki et al. |
| 2010/0081252 A1 | 4/2010 | Makino |
| 2010/0120226 A1 | 5/2010 | Yamazaki et al. |
| 2010/0291752 A1 | 11/2010 | Okuno |
| 2010/0330779 A1 | 12/2010 | Okuno et al. |
| 2011/0124179 A1 | 5/2011 | Tokunaga et al. |

FOREIGN PATENT DOCUMENTS

| | | |
|---|---|---|
| JP | 2005-252244 | 9/2005 |
| JP | 2009-111363 | 5/2009 |
| JP | 2009-111371 | 5/2009 |
| JP | 2009-111372 | 5/2009 |
| JP | 2009-135448 | 6/2009 |
| JP | 2010-103513 | 5/2010 |
| JP | 2011-077506 | 4/2011 |
| JP | 2011-086922 | 4/2011 |

* cited by examiner

SOI SUBSTRATE AND MANUFACTURING METHOD THEREOF

BACKGROUND OF THE INVENTION

1. Field of the Invention

One embodiment of the disclosed invention relates to a silicon on insulator (SOI) substrate and a manufacturing method thereof.

2. Description of the Related Art

In recent years, a silicon on insulator (SOI) substrate that includes a thin single crystal silicon layer on an insulating surface has been developed instead of a bulk silicon wafer.

As an example of a method for manufacturing an SOI substrate, the following method can be given. Hydrogen ions are added to a single crystal silicon substrate so that an embrittlement layer (also referred to as a separation layer) is formed. A base substrate (for example a glass substrate) and the single crystal silicon substrate are bonded to each other. The bonded single crystal silicon substrate is heated so that a thin single crystal layer is separated along the embrittlement layer; accordingly, a thin single crystal layer is formed over the base substrate (see Patent Documents 1 to 4).

REFERENCES

[Patent Document 1] Japanese Published Patent Application No. 2009-111363
[Patent Document 2] Japanese Published Patent Application No. 2009-111371
[Patent Document 3] Japanese Published Patent Application No. 2009-111372
[Patent Document 4] Japanese Published Patent Application No. 2009-135448

SUMMARY OF THE INVENTION

The above-described mechanism in which a surface layer, a silicon layer, is separated along the embrittlement layer formed in the single crystal silicon substrate is considered due to a function of hydrogen which is added to the single crystal silicon substrate. In other words, hydrogen microbubbles are generated when the single crystal silicon substrate including an embrittlement layer is heated, and then, the volume of the embrittlement layer expands and inner pressure of the embrittlement layer increases; accordingly, a crack is generated.

In that case, the size of the hydrogen microbubbles and positions where the hydrogen microbubbles are generated are not controlled precisely; therefore, positions where the cracks are generated in the embrittlement layer are arbitrary. Accordingly, there is a problem in that surface of the silicon layer separated along the embrittlement layer is not a mirror-flat surface of the like practically; thus, planarity of the surface is deteriorated.

It is an object of one embodiment of the present invention to improve the planarity of a semiconductor layer in an SOI substrate in which the semiconductor layer is formed over a base substrate by bonding a bond substrate (for example, a single crystal silicon substrate) thereto.

In one embodiment of the disclosed invention, in a step of performing a heat treatment to separate along the embrittlement layer, an entire surface of a substrate in which the bond substrate and the base substrate are bonded to each other is heated at a temperature lower than a temperature at which a large amount of microbubbles are generated in the embrittlement layer and a part of the bonded substrate is heated at a temperature higher than the aforementioned heating temperature so that the bond substrate is separated, whereby, a semiconductor layer is formed over the base substrate. The temperature of partially heating is preferably greater than to the temperature of wholly heating by 10° C. or more and the maximum temperature of partially heating is preferably less than or equal to 30° C. higher than to the temperature of wholly heating.

Bubble growth in the region in the part of the bonded substrate which is heated at a higher temperature proceeds faster than the other region, whereby only the region in the part of the bonded substrate is separated first. Separation proceeds from the separated region to the other region of the bonded substrate, whereby the semiconductor layer is separated. In this manner, the semiconductor layer can be provided over the base substrate.

At that time, difference in temperature between the region in the part of the bonded substrate and the other region, or the heating temperatures of the region in the part of the bonded substrate and the other region are controlled appropriately. In the case where the difference in temperature or the heating temperature is controlled appropriately, even when the heating temperature of the other region is low, the other region can also be separated by separating the region in the part of the bonded substrate. In the region (the other region) other than the region in which heating temperature is increased (the region in the part of the bonded substrate), bubble growth does not proceed sufficiently at the time when the separation is performed. The region in which bubble growth does not proceed sufficiently is separated, so that the surface roughness occurring in the case where the semiconductor layer is separated can be prevented.

In one embodiment of the invention, a trigger for separating the semiconductor layer is the temperature difference in the heating. Therefore, a region which triggers the separation does not need to be formed; thus, the number of steps for manufacturing an SOI substrate can be reduced.

In one embodiment of the invention, a region which triggers the separation does not need to be formed; therefore, manufacturing cost of an SOI substrate can be reduced.

In one embodiment of the invention, the number of steps and cost for manufacturing an SOI substrate are reduced, so that yield of a semiconductor device manufactured by using the semiconductor layer of the SOI substrate can be improved.

In one embodiment of the disclosed invention, with a heating device having an in-plane uniform temperature distribution, the bond substrate is heated as a whole, until a stage in which microbubbles are generated from an embrittlement region. The step of heating to generate microbubbles is referred to as a first heat treatment.

Then, as a second heat treatment, a region other than a device formation region, such as an end portion of a substrate, is partially heated. Only the microbubbles generated in the region heated partially are grown to a state (a size) at which a semiconductor layer can be separated to be transferred. That is, the microbubbles in the region heated partially are to a state at which the microbubbles are connected to each other to form a large bubble.

The region heated partially functions as a trigger and the separation proceeds to the other region in which the microbubbles are generated. Accordingly, separation in the bond substrate and formation of the semiconductor layer over a base substrate can be performed.

In a region which is not heated partially in the second heat treatment, bubbles do not grow excessively. Therefore, there is an advantage that surface roughness of the semiconductor layer after being separated and transferred can be suppressed. Note that the first heat treatment and the second heat treatment may be performed continuously or discontinuously.

In one embodiment of the invention, a trigger for separating the semiconductor layer is the temperature difference in the heating. Therefore, a region which triggers the separation does not need to be formed; thus, the number of steps for manufacturing an SOI substrate can be reduced.

In one embodiment of the invention, a region which triggers the separation does not need to be formed; therefore, manufacturing cost of an SOI substrate can be reduced.

In one embodiment of the invention, the number of steps and cost for manufacturing an SOI substrate are reduced, so that yield of a semiconductor device manufactured by using the semiconductor layer of the SOI substrate can be improved.

One embodiment of the disclosed invention is a method for manufacturing an SOI substrate. Ions are added to a bond substrate, so that an embrittlement layer is formed in the bond substrate; the bond substrate is bonded to a base substrate with an insulating layer provided therebetween; and a part of a region of the bonded bond substrate is heated at a temperature higher by 10° C. or more and 30° C. or less, than a temperature of the other part of the region of the bonded bond substrate, so that separation proceeds from the part of the region of the bond substrate to the other part of the region of the bond substrate in the embrittlement layer. Accordingly, a semiconductor layer is provided over the base substrate.

One embodiment of the disclosed invention is a method for manufacturing an SOI substrate. Ions are added to a bond substrate, so that an embrittlement layer is formed in the bond substrate; the bond substrate is bonded to a base substrate with an insulating layer provided therebetween; and a part of a region of the bonded bond substrate is heated at a temperature higher by 10° C. or more and 15° C. or less, than a temperature of the other part of the region of the bonded bond substrate, so that separation proceeds from the part of the region of the bond substrate to the other part of the region of the bond substrate in the embrittlement layer. Accordingly, a semiconductor layer is provided over the base substrate.

One embodiment of the disclosed invention is a method for manufacturing an SOI substrate. Ions are added to a bond substrate, so that an embrittlement layer is formed in the bond substrate; the bond substrate is bonded to a base substrate with an insulating layer provided therebetween; a first heat treatment is performed on the bonded bond substrate as a whole at a first temperature; and a second heat treatment is performed on a part of a region of the bonded bond substrate at a second temperature higher by 10° C. or more than the temperature of the first heat treatment, so that separation proceeds from the part of the region of the bond substrate to the other part of the region of the bond substrate in the embrittlement layer. Accordingly, a semiconductor layer is provided over the base substrate.

An SOI substrate having an average surface roughness less than or equal to 6.0 nm can be provided using the aforementioned manufacturing method.

An SOI substrate having the maximum peak-to-valley height less than or equal to 150 nm can be provided using the aforementioned manufacturing method.

An SOI substrate having a root-mean-square surface roughness less than or equal to 10 nm can be provided using the aforementioned manufacturing method.

One embodiment of the disclosed invention is a method for manufacturing an SOI substrate. Ions are added to a bond substrate, so that an embrittlement layer is formed in the bond substrate; the bond substrate is bonded to a base substrate with an insulating layer provided therebetween; and a part of a region of the bonded bond substrate is heated at a temperature higher by 10° C. or more and 30° C. or less, than a temperature of the other part of the region of the bonded bond substrate, so that separation proceeds from the part of the region of the bond substrate to the other part of the region of the bond substrate along the embrittlement layer. According to this embodiment, a first semiconductor layer is provided over the base substrate, and a part of a region of the bond substrate in the first semiconductor layer is removed, so that a second semiconductor layer is provided using the other part of the region in the first semiconductor layer.

One embodiment of the disclosed invention is a method for manufacturing an SOI substrate. Ions are added to a bond substrate, so that an embrittlement layer is formed in the bond substrate; the bond substrate is bonded to a base substrate with an insulating layer provided therebetween; and a part of a region of the bonded bond substrate is heated at a temperature higher by 10° C. or more and 15° C. or less, than a temperature of the other part of the region of the bonded bond substrate, so that separation proceeds from the part of the region of the bond substrate to the other part of the region of the bond substrate along the embrittlement layer. According to this embodiment, a first semiconductor layer is provided over the base substrate, and a part of a region of the bond substrate in the first semiconductor layer is removed, so that a second semiconductor layer is provided using the other part of the region in the first semiconductor layer.

One embodiment of the disclosed invention is a method for manufacturing an SOI substrate. Ions are added to a bond substrate, so that an embrittlement layer is formed in the bond substrate; the bond substrate is bonded to a base substrate with an insulating layer provided therebetween; a first heat treatment is performed on the bonded bond substrate as a whole, at a first temperature; and a second heat treatment is performed on a part of a region of the bonded bond substrate at a second temperature higher by 10° C. or more than the temperature of the first heat treatment, so that separation proceeds from the part of the region of the bond substrate to the other part of the region of the bond substrate along the embrittlement layer. According to this embodiment, a first semiconductor layer is provided over the base substrate, and a part of a region of the bond substrate in the first semiconductor layer is removed, so that a second semiconductor layer is provided using the other part of the region in the first semiconductor layer.

An SOI substrate having an average surface roughness less than or equal to 6.0 nm can be provided using the aforementioned manufacturing method.

An SOI substrate having the maximum peak-to-valley height less than or equal to 150 nm can be provided using the aforementioned manufacturing method.

An SOI substrate having a root-mean-square surface roughness less than or equal to 10 nm can be provided using the aforementioned manufacturing method.

According to the present invention, an SOI substrate having a semiconductor layer with less surface roughness can be provided. With the semiconductor layer of the SOI substrate, yield of a semiconductor device can be improved.

DETAILED DESCRIPTION OF THE INVENTION

Figure 1A:
FIGS. 1A to 1D are cross-sectional views of an example of a manufacturing process of an SOI substrate.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to description of the embodiments. Note that, in the drawings hereinafter shown, the same portions or portions having similar functions are denoted by the same reference numerals, and repeated description thereof will be omitted.

Embodiment 1

In this embodiment, an example of a manufacturing process of an SOI substrate will be described with reference to FIGS. 1A to 1D, FIGS. 2A to 2D, and FIGS. 3A to 3D. Specifically, an SOI substrate in which a single crystal semiconductor layer is provided over a base substrate and a manufacturing method thereof will be described.

First, a bond substrate is prepared. In this embodiment, a single crystal semiconductor substrate 110 is used as the bond substrate (see FIG. 1A).

Note that in this embodiment, after the bond substrate is processed, the base substrate is processed; however, an embodiment of the disclosed invention is not construed as being limited thereto. Alternatively, the base substrate may be processed first, or the bond substrate may be processed at the same time as the base substrate.

As the single crystal semiconductor substrate 110, a single crystal semiconductor substrate formed with an element belonging to Group 14 of the periodic table, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 110 is not limited to circular, and the single crystal semiconductor substrate 110 may be a substrate which has been processed into, for example, a rectangular shape or the like. Further, the single crystal semiconductor substrate 110 can be manufactured by a CZ method or a floating zone (FZ) method.

Note that in this embodiment, the case of using a single crystal semiconductor substrate as the bond substrate is described; however, an embodiment of the disclosed invention is not construed as being limited thereto. For example, as the bond substrate, a polycrystalline semiconductor substrate or the like may be used.

Figure 1B:
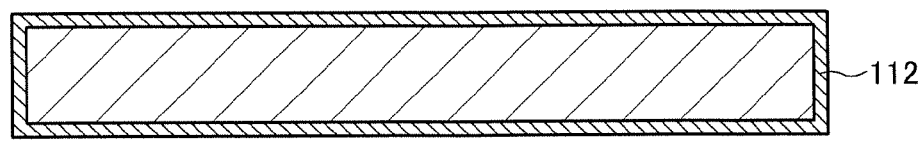

An oxide film 112 is formed over a surface of the single crystal semiconductor substrate 110 (see FIG. 1B). In view of removal of contamination, it is preferable that the surface of the single crystal semiconductor substrate 110 be cleaned with a sulfuric acid/hydrogen peroxide mixture (SPM), an ammonium hydrogen peroxide mixture (APM), a hydrochloric acid/hydrogen peroxide mixture (HPM), diluted hydrofluoric acid (DHF), FPM (a mixed solution of hydrofluoric acid, hydrogen peroxide, and pure water), or the like before formation of the oxide film 112. Alternatively, dilute hydrofluoric acid and ozone water may be discharged alternately for cleaning.

The oxide film 112 can be formed with, for example, any of a single layer of a silicon oxide film, a silicon oxynitride film, or the like or a stack of any of the above films. As a method for forming the oxide film 112, a thermal oxidation method, a CVD method, a sputtering method, or the like can be used. When the oxide film 112 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 112 (here, a $SiO_x$ film) is formed by performing thermal oxidation treatment of the single crystal semiconductor substrate 110. Note that the thermal oxidation treatment may be performed in an oxidation atmosphere to which halogen is added.

Figure 1C:
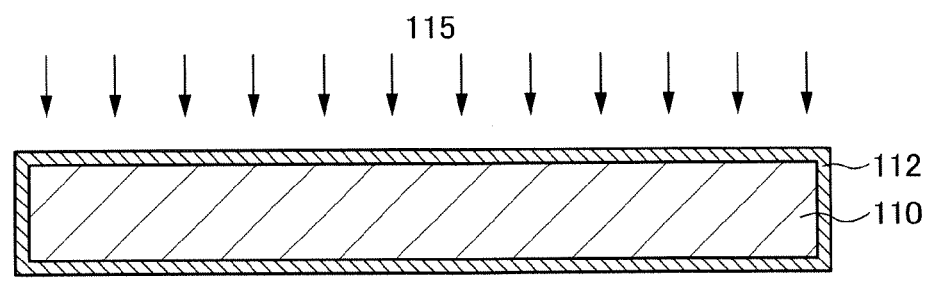

One surface of the single crystal semiconductor substrate 110 over which the oxide film 112 is formed is irradiated with hydrogen ions 115 accelerated by an electric field so that hydrogen is added to the single crystal semiconductor substrate 110 (see FIG. 1C).

Figure 1D:
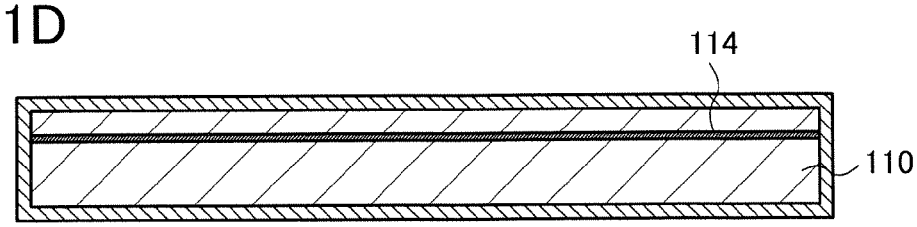

Thus, an embrittlement layer 114 whose crystal structure is damaged is formed in the single crystal semiconductor substrate 110 at a predetermined depth (see FIG. 1D).

The depth at which the embrittlement layer 114 is formed can be adjusted by the kinetic energy, mass, charge, or incidence angle of the ions 115, or the like. The embrittlement layer 114 is formed at approximately the same depth as the average penetration depth of the ions 115. Therefore, the thickness of the single crystal semiconductor layer to be separated from the single crystal semiconductor substrate 110 can be controlled by the depth at which the ions 115 are added. For example, the average penetration depth may be controlled so that the thickness of the single crystal semiconductor layer is approximately greater than or equal to 10 nm and less than or equal to 500 nm, preferably, greater than or equal to 50 nm and less than or equal to 200 nm.

The irradiation treatment with ions 115 can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, the ion-implantation apparatus is a mass-separation apparatus. In the ion-implantation apparatus, mass separation of ion species of plasma is performed and the object to be processed is irradiated with ion species having predetermined masses.

In this embodiment, an example in which the ion-doping apparatus is used to add hydrogen ions as the ions 115 to the single crystal semiconductor substrate 110 is described. A gas containing hydrogen is used as a source gas. As for ions used for the irradiation, the proportion of $H_3^+$ is preferably set high. Specifically, it is preferable that the proportion of $H_3^+$ be set 50% or higher (more preferably, 80% or higher) with respect to the total amount of $H^+$, $H_2^+$, and $H_3^+$. With a high proportion of $H_3^+$, the efficiency of ion irradiation can be improved.

Note that in this embodiment, hydrogen ions are used as ions to be added; however, ions to be added are not limited to hydrogen ions. Ions of helium or the like may be added. Further, ions to be added are not limited to one kind of ions, and plural kinds of ions may be added. For example, in the case where irradiation with hydrogen and irradiation with helium are performed with the ion-doping apparatus at the same time, the number of steps can be reduced as compared to the case where irradiation with hydrogen and irradiation with helium are separately performed.

Here, the base substrate and the treatment thereof are described. First, a base substrate 100 is prepared (see FIG. 2A).

As the base substrate 100, a substrate made from an insulator can be used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. Further, a ceramic substrate which contains silicon nitride and aluminum oxide as its main components and whose coefficient of thermal expansion is close to that of silicon may be used. Note that in this embodiment, the case where a glass substrate is used as the base substrate 100 is described. When a glass substrate which can have a larger size and is inexpensive is used as the base substrate 100, a cost reduction can be achieved.

Alternatively, a semiconductor substrate such as a single crystal silicon substrate or a single crystal germanium substrate may be used as the base substrate 100. In the case of using the semiconductor substrate as the base substrate 100, the temperature limitation for heat treatment can be raised compared with the case of using a glass substrate or the like; thus, a high-quality SOI substrate is easily obtained. Here, as the semiconductor substrate, a solar grade silicon (SOG-Si) substrate or the like may be used. Alternatively, a polycrystalline semiconductor substrate may be used. In the case of using the SOG-Si substrate, the polycrystalline semiconductor substrate, or the like, manufacturing cost can be reduced as compared to the case of using the single crystal silicon substrate or the like.

A surface of the base substrate 100 is preferably cleaned in advance. Specifically, the base substrate 100 is subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like. Through such cleaning treatment, for example, the surface planarity of the base substrate 100 can be improved and abrasive particles left on the surface of the base substrate 100 can be removed.

Figure 2A:
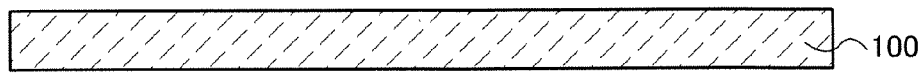
FIGS. 2A to 2D are cross-sectional views of an example of a manufacturing process of an SOI substrate.
Figure 2B:
Figure 2C:
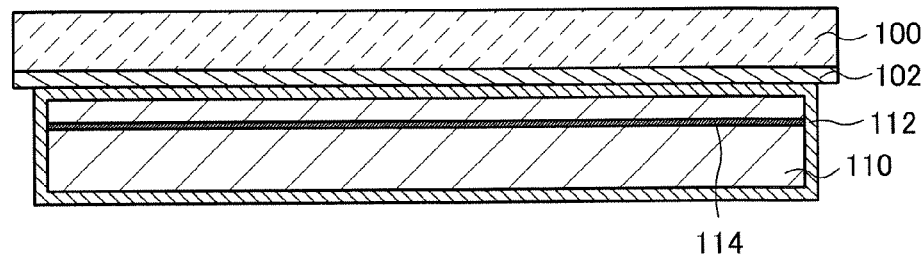
Figure 2D:
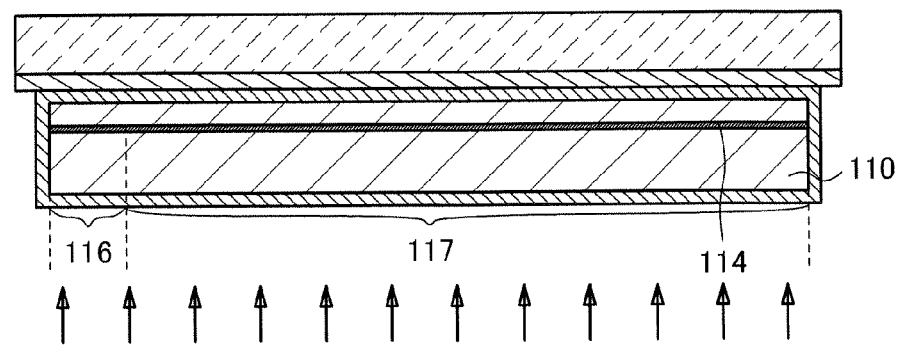

Next, a nitrogen-containing layer 102 (for example, a layer including an insulating film containing nitrogen, such as a silicon nitride ($SiN_x$) film or a silicon nitride oxide ($SiN_xO_y$, (x>y)) film) is formed over the surface of the base substrate 100 (see FIG. 2B). The nitrogen-containing layer 102 can be formed by a CVD method, a sputtering method, or the like.

Note that in this specification, oxynitride refers to a substance that contains more oxygen (atoms) than nitrogen. For example, silicon oxynitride is a substance containing oxygen, nitrogen, silicon, and hydrogen in ranges of 50 at. % to 70 at. %, 0.5 at. % to 15 at. %, 25 at. % to 35 at. %, and 0.1 at. % to 10 at. %, respectively. Further, nitride oxide refers to a substance that contains more nitrogen (atoms) than oxygen. For example, silicon nitride oxide is a substance containing oxygen, nitrogen, silicon, and hydrogen in ranges of 5 at. % to 30 at. %, 20 at. % to 55 at. %, 25 at. % to 35 at. %, and 10 at. % to 30 at. %, respectively. Note that the above ranges are obtained by measurement using Rutherford backscattering spectrometry (RBS) or hydrogen forward scattering spectrometry (HFS). Moreover, the total of the percentages of the constituent elements does not exceed 100 at. %.

The nitrogen-containing layer 102 formed in this embodiment functions as a layer for bonding the single crystal semiconductor layer (as a bonding layer) in a later step. The nitrogen-containing layer 102 also functions as a barrier layer for preventing an impurity contained in the base substrate, such as sodium (Na), from diffusing into the single crystal semiconductor layer.

As described above, since the nitrogen-containing layer 102 serves as the bonding layer in this embodiment, it is preferable that the surface of the nitrogen-containing layer 102 be formed to have a certain level of planarity. Specifically, the nitrogen-containing layer 102 is formed such that it has an average surface roughness (Ra) of 0.5 nm or less and a root-mean-square surface roughness (RMS) of 0.60 nm or less, preferably, an average surface roughness of 0.35 nm or less and a root-mean-square surface roughness of 0.45 nm or less. The thickness is in the range of greater than or equal to 10 nm and less than or equal to 200 nm, preferably, greater than or equal to 50 nm and less than or equal to 100 nm. With the surface planarity improved as described above, the bonding defect of the single crystal semiconductor layer can be prevented.

Then, the surface of the base substrate 100 and the surface of the single crystal semiconductor substrate 110 are disposed to face each other and the surface of the nitrogen-containing layer 102 and a surface of the oxide film 112 are disposed in contact with each other. Thus, the base substrate 100 and the single crystal semiconductor substrate 110 can be bonded to each other (see FIG. 2C). Note that in this specification, both the nitrogen-containing layer 102 and the oxide film 112 are insulating films; therefore, the nitrogen-containing layer 102 and the oxide film 112 may be collectively referred to as an insulating film or an insulating layer.

When bonding is performed, it is preferable that a pressure of greater than or equal to 0.001 $N/cm^2$ and less than or equal to 100 N/cm², e.g., a pressure of greater than or equal to 1 N/cm² and less than or equal to 20 N/cm², be applied to one part of the base substrate 100 or one part of the single crystal semiconductor substrate 110. When the bonding surfaces are made close to each other and disposed in contact with each other by applying a pressure, a bonding between the nitrogen-containing layer 102 and the oxide film 112 is generated at the part where the close contact is made, and the bonding spontaneously spreads to almost the entire area. This bonding is performed under the action of the Van der Waals force or hydrogen bonding and can be performed at room temperature.

Note that before the single crystal semiconductor substrate 110 and the base substrate 100 are bonded to each other, surfaces to be bonded to each other are preferably subjected to surface treatment. Surface treatment can improve the bonding strength at the interface between the single crystal semiconductor substrate 110 and the base substrate 100.

As the surface treatment, wet treatment, dry treatment, or a combination of wet treatment and dry treatment can be used. Alternatively, wet treatment may be used in combination with different wet treatment or dry treatment may be used in combination with different dry treatment.

As examples of the wet treatment, ozone treatment using ozone water (ozone water cleaning), megasonic cleaning, two-fluid cleaning (a method in which functional water such as pure water or hydrogenated water and a carrier gas such as nitrogen are sprayed together), and the like can be given. As examples of the dry treatment, ultraviolet treatment, ozone treatment, plasma treatment, plasma treatment with bias application, radical treatment, and the like can be given. The surface treatment described above has the effect of improving hydrophilicity and cleanliness of the surfaces of the objects to be processed (i.e., the single crystal semiconductor substrate 110, the oxide film 112 formed on the single crystal semiconductor substrate 110, the base substrate 100, or the nitrogen-containing layer 102 formed on the base substrate 100). As a result, the boning strength between the substrates can be improved.

The wet treatment is effective for removal macro dust and the like adhering to the surfaces of the objects to be processed. The dry treatment is effective for removal or decomposition of micro dust such as an organic substance adhering to the surfaces of the objects to be processed. The case in which the dry treatment such as ultraviolet treatment is performed and then the wet treatment such as cleaning is performed is preferable because the surfaces of the objects to be processed can be made clean and hydrophilic and generation of watermarks on the surfaces of the objects to be processed can be suppressed.

As the dry treatment, it is preferable to perform surface treatment using ozone or oxygen in an active state such as singlet oxygen. Ozone or oxygen in an active state such as singlet oxygen enables organic substances adhering to the surfaces of the objects to be processed to be removed or decomposed effectively. Further, the treatment using ozone or oxygen in an active state such as singlet oxygen may be combined with treatment using ultraviolet light having wavelengths less than 200 nm, so that the organic substances adhering to the surfaces of the objects to be processed can be removed more effectively.

For example, irradiation with ultraviolet light under the atmosphere containing oxygen is performed to perform the surface treatment of the object to be processed. Irradiation with ultraviolet light having wavelengths less than 200 nm and ultraviolet light having wavelengths greater than or equal to 200 nm under the atmosphere containing oxygen may be performed, so that ozone and singlet oxygen can be generated. Alternatively, irradiation with ultraviolet light having wavelengths less than 180 nm may be performed, so that ozone and singlet oxygen can be generated. Under the atmosphere containing oxygen, irradiation with ultraviolet light having a wavelength less than 180 nm is performed to generate ozone and to generate singlet oxygen by decomposing ozone or oxygen. The above-described surface treatment can be performed by, for example, irradiation with a Xe excimer UV lamp under the atmosphere containing oxygen.

After the single crystal semiconductor substrate 110 and the base substrate 100 are bonded to each other, the single crystal semiconductor substrate 110 is heated so that bubbles of hydrogen are generated from the embrittlement layer 114 in which crystal structure is damaged by the irradiation with ions 115. Note that in the single crystal semiconductor substrate 110, heat treatment is performed as follows: a region 117 (hereinafter referred to as an other region 117) which is other than a region 116 which is a part of the single crystal semiconductor substrate 110 to be described later is heated to a temperature at which the microbubbles of hydrogen are generated (referred to as a first temperature for convenience); and the region 116 which is a part of the single crystal semiconductor substrate 110 is heated to a temperature at which the microbubbles are connected to form a large bubble (referred to as a second temperature for convenience). Difference between the temperatures at which the microbubbles are generated (the first temperature) and at which the microbubbles are connected to form a large bubble (the second temperature) is 10° C. to 30° C., preferably, 10° C. to 15° C. Therefore, the single crystal semiconductor substrate 110 is heated so that the region 116 which is a part of the single crystal semiconductor substrate 110 is 10° C. to 30° C. higher, preferably, 10° C. to 15° C. higher than the other region 117 (see FIG. 2D).

For example, a first heat treatment and a second heat treatment are performed in succession under the following conditions: a single crystal silicon substrate is used as the single crystal semiconductor substrate 110, hydrogen ions are used as the ions 115, and the dose of hydrogen is $2.0 \times 10^{16}$ ions/cm². In the first heat treatment, the temperature of the single crystal silicon substrate is raised around 485° C. to 490° C. at a temperature raising rate of 7.0° C./min and a region 136 is locally heated at 500° C. at the same temperature raising rate in succession. The hydrogen bubbles start to grow at the temperature of 485° C. to 490° C. and separation starts at the temperature of 500° C. when the temperature of the single crystal semiconductor substrate 110 continues to rise at the temperature raising rate of 7.0° C./min.

Figure 3A:
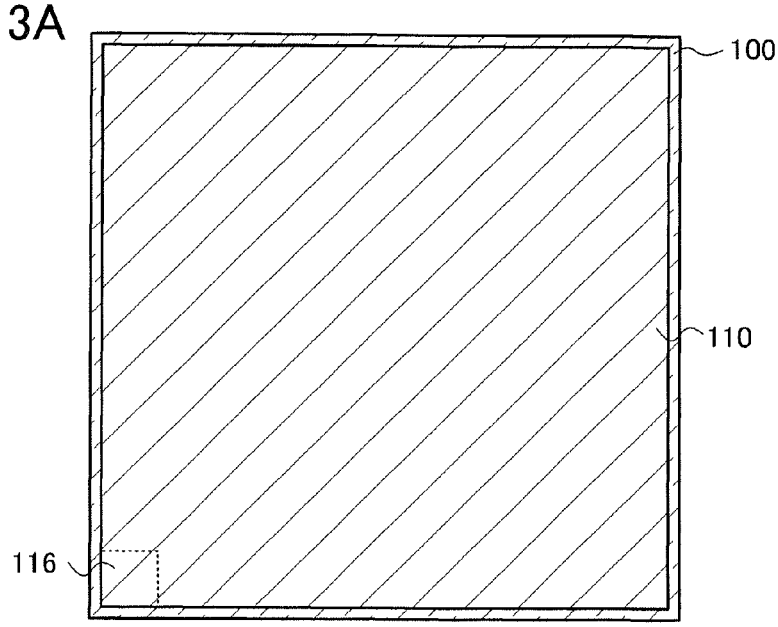
FIG. 3A is a top view and FIGS. 3B to 3D are cross-sectional views of an example of a manufacturing process of an SOI substrate.
Figure 3B:
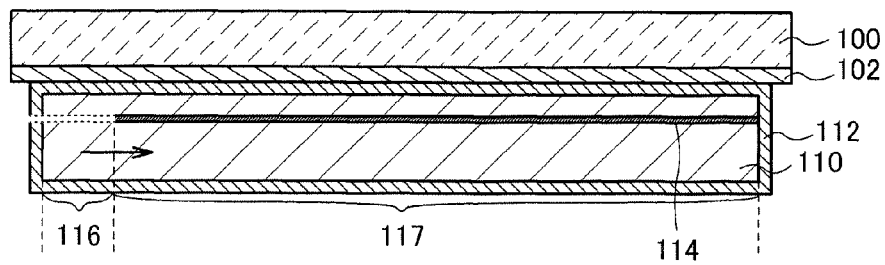
Figure 3C:
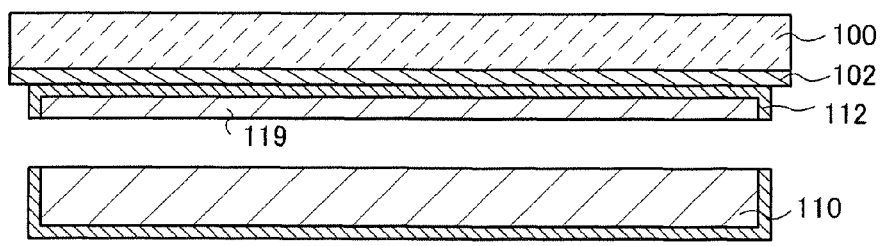

In FIG. 3A, a top view including the single crystal semiconductor substrate 110, the region 116 which is a part of the single crystal semiconductor substrate 110, and the base substrate 110 is illustrated. The region 116 is a sacrificial region for separation and thus the region 116 is formed at the end portion of the single crystal semiconductor substrate 110 as much as possible. In addition, it is preferable that the region 116 be arranged so that a region including a surface with less surface roughness in other words, a region including a uniform surface, of a single crystal semiconductor layer 119, which is formed by separation later, is formed as large as possible and so that a semiconductor element formed including the single crystal semiconductor layer 119 can be formed as much as possible or as large as possible.

The single crystal semiconductor substrate 110 may have the region 116 in one portion and the size of the region 116 is not limited as long as the single crystal semiconductor substrate 110 as a whole can be separated when the region 116 is separated. For example, the size of the region 116 may be 2.0 cm×2.0 cm, preferably 1.0 cm×1.0 cm with respect to the single crystal semiconductor substrate 110 which is a 5-inch substrate (12.7 cm×12.7 cm).

In order to heat the region 116 which is a part of the single crystal semiconductor substrate 110 and the other region 117 at different temperatures, the single crystal semiconductor substrate 110 may be heated with a heating device capable of varying in-plane temperature distribution depending on the position. As an example of such a heating device, a hot plate in which a heater is provided so that surface temperatures of the flat heating plate are different in each portion.

When the single crystal semiconductor substrate 110 is heated as described above, a large bubble is formed in the region 116 which is heated at higher temperature than the other region 117. Inner pressure of the single crystal semiconductor substrate 110 is raised by the large bubble formed in this manner. A crack is generated in the region 116 due to the increase in pressure and the crack extends from the region 116 to the region 117 (see FIG. 3B). With the crack extends, the single crystal semiconductor layer 119 is separated from the single crystal semiconductor substrate 110, whereby the single crystal semiconductor layer 119 is formed over the base substrate 100 (see FIG. 3C). Thus, the SOI substrate including the single crystal semiconductor layer 119 whose surface roughness is reduced, over the base substrate 100 formed of an insulator is manufactured (see FIG. 3D).

As described in this embodiment, the SOI substrate having a semiconductor layer with less surface roughness can be provided. With the semiconductor layer of the SOI substrate, yield of a semiconductor device can be improved.

Embodiment 2

In this embodiment, an example of a manufacturing method of an SOI substrate which is different from Embodiment 1 will be described with reference to FIGS. 8A to 8C and FIGS. 9A and 9B. The manufacturing method of the SOI substrate according to this embodiment is common to that of Embodiment 1 in many points, and thus detailed description of the same points will be omitted.

As treatments for the single crystal semiconductor substrate 110 as the bond substrate, the same process described using FIGS. 1A to 1D and in the description thereof in the Embodiment 1 is performed first. Embodiment 1 can be referred to for the details.

As for the base substrate 100, the process up to and including formation of the nitrogen-containing layer 102 over the base substrate 100 is carried out on the basis of FIGS. 2A and 2B and the description thereof in Embodiment 1.

Next, in the same manner to Embodiment 1, the surface of the base substrate 100 and the surface of the single crystal semiconductor substrate 110 are face each other so that the surface of the nitrogen-containing layer 102 and the surface of the oxide film 112 are made in contact with each other. Thus, the base substrate 100 and the single crystal semiconductor substrate 110 can be bonded to each other (see FIG. 2C).

Figure 8A:
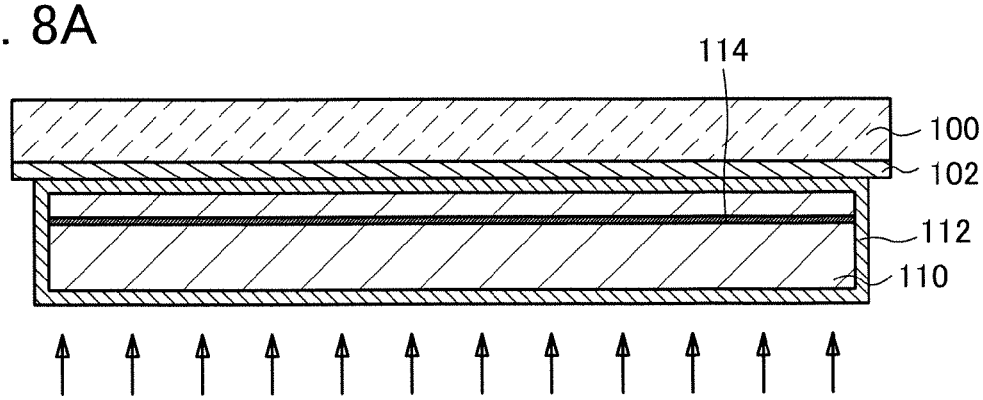
FIGS. 8A to 8C are cross-sectional views of an example of a manufacturing process of an SOI substrate.
Figure 8B:
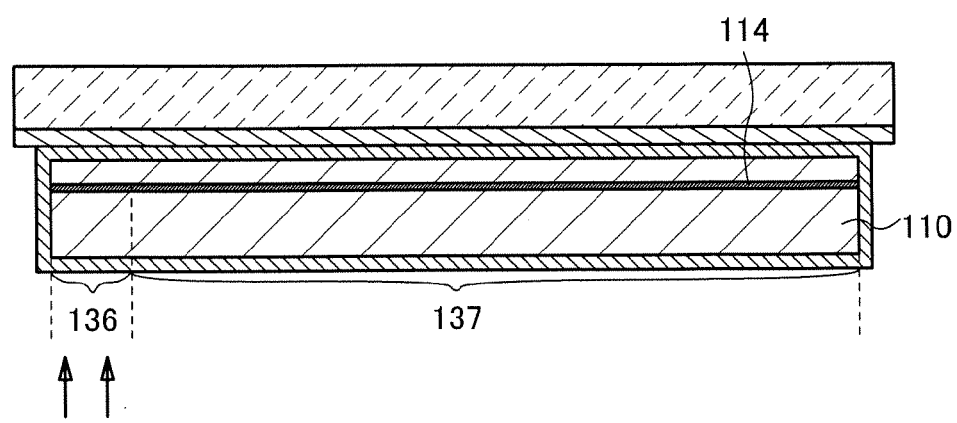
Figure 8C:
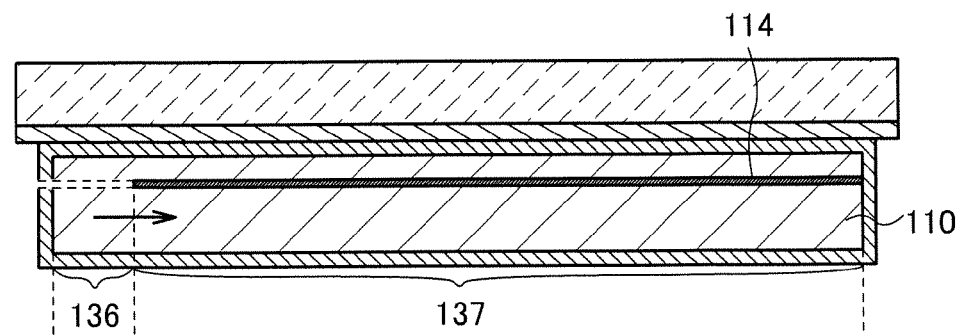

Then, using a heating device having an in-plane uniform temperature distribution (preferably the temperature distribution is greater than or equal to −2° C. and less than or equal to 2° C.), a first heat treatment is performed on the single crystal semiconductor substrate 110 to generate hydrogen bubbles from the embrittlement layer 114 whose crystal structure is damaged by adding ions 115 (see FIG. 8A). At this step, the temperature of the first heat treatment is lower than a temperature at which hydrogen microbubbles grow wholly in the single crystal semiconductor substrate 110. That is, the temperature of the first heat treatment is 10° C. to 30° C. lower, preferably 10° C. to 15° C. lower than the temperature at which the single crystal semiconductor substrate 110 is separated from the embrittlement layer 114. The temperature at which hydrogen microbubbles are generated is the same as the first temperature in Embodiment 1.

Next, as a second heat treatment, a region 136 which is a part of the single crystal semiconductor substrate 110 is partially heated. The temperature of the second heat treatment is set at least a temperature at which the hydrogen microbubbles are grown to connect to form a large hydrogen bubble (see FIG. 8B). The temperature at which the large hydrogen bubble is formed is the same as the second temperature in Embodiment 1.

In this embodiment, hydrogen microbubbles are already generated in the single crystal semiconductor substrate 110 by performing the first heat treatment, which is different from Embodiment 1. Therefore, even when the temperature of the second heat treatment for heating the region 136 is more than 15° C. higher or more than 30° C. higher than the temperature of the first heat treatment, hydrogen microbubbles in the other region 137, which is described later, are grow such that separation can be performed. In this manner, even if the other region 137 is separated when the region 136 is separated, a single crystal semiconductor layer whose surface roughness is reduced can be obtained.

On the other hand, in Embodiment 1, the region 116 of the single crystal semiconductor substrate 110 is heated at the same time as the other region 117. Therefore, in the case where difference in temperature between the region 116 of the single crystal semiconductor substrate 110 and the other region 117 is greater than 15° C. or greater than 30° C., the hydrogen bubbles in the other region 117 are not grown yet enough to separate the region 117 when the region 116 is separated, which weaken the effect of suppressing surface roughness.

When the second hear treatment is performed, heat applied to the region 136 is propagated to the other region 137 of the single crystal semiconductor substrate 110 so that the temperature of the region 137 is kept not to grow the hydrogen microbubbles which are generated before. Alternatively, in the similar manner to Embodiment 1, the region 136 of the single crystal semiconductor substrate 110 may be heated at the second temperature, and the other region 137 may be heated at the first temperature.

The single crystal semiconductor substrate 110 may have the region 136 in one portion and the size of the region 136 is not limited as long as the single crystal semiconductor substrate 110 as a whole can be separated when the region 136 is separated. For example, the size of the region 136 may be 2.0 cm×2.0 cm, preferably 1.0 cm×1.0 cm with respect to the single crystal semiconductor substrate 110 which is a 5-inch substrate (12.7 cm×12.7 cm).

The single crystal semiconductor substrate 110 is heated as described above so that the inner pressure of the region 136 is increased due to a large bubble formed in the region 136 which is partially heated. A crack is generated in the region 136 due to the increase in pressure and the crack extends from the region 136 to the region 137 (see FIG. 8C). With the crack extends, the single crystal semiconductor layer 139 is separated from the single crystal semiconductor substrate 110, whereby the single crystal semiconductor layer 119 is formed over the base substrate 100 (see FIG. 9A). Thus, the SOI substrate including the single crystal semiconductor layer 139 whose surface roughness is reduced, over the base substrate 100 formed of an insulator (see FIG. 9B).

As described in this embodiment, the SOI substrate having a semiconductor layer with less surface roughness can be provided. With the semiconductor layer of the SOI substrate, yield of a semiconductor device can be improved.

Embodiment 3

In this embodiment, a manufacturing method of a semiconductor device using the SOI substrate according to the aforementioned embodiments will be described with reference to FIGS. 10A to 10E, FIGS. 11A to 11D, and FIG. 12. In this embodiment, a manufacturing method of a semiconductor device including a plurality of transistors will be described as an example of the semiconductor device. Various semiconductor devices can be formed with the use of transistors described below in combination.

Figure 3D:
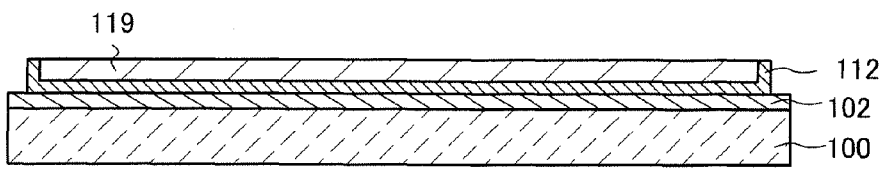
Figure 9A:
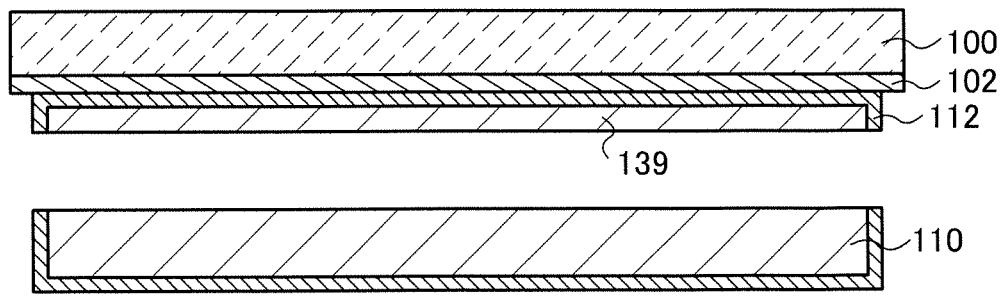
FIGS. 9A and 9B are cross-sectional views of an example of a manufacturing process of an SOI substrate.
Figure 9B:
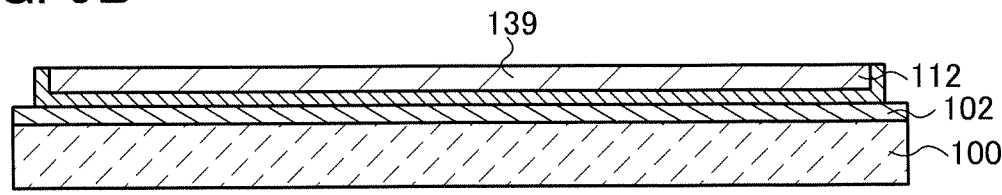
Figure 10A:
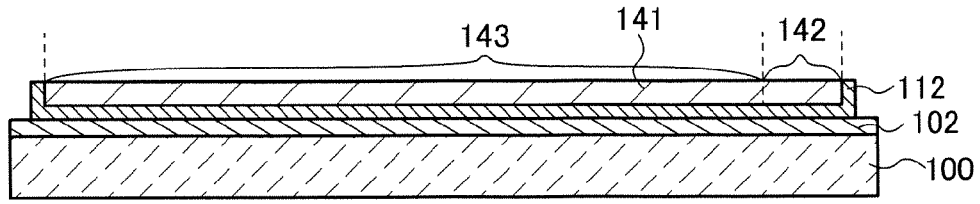
FIGS. 10A to 10E are cross-sectional views of an example of a manufacturing process of a semiconductor device.

FIG. 10A is a cross-sectional view illustrating a part of the SOI substrate manufactured using the method described in aforementioned embodiments (for example, see FIG. 3D or 9B).

A semiconductor layer 141 corresponds to the single crystal semiconductor layer 119 in FIG. 3D and the single crystal semiconductor layer 139 in FIG. 9B. The semiconductor layer 141 includes a region 142 having surface roughness. The region 142 corresponds to the region 116 and the region 136 from which the separation start. In the semiconductor layer 141, a region 143 which is other than the region 142 corresponds to the region 117 and the region 137 and the region 143 has a surface with less surface roughness.

In order to control the threshold voltage of the transistor, a p-type impurity element such as boron, aluminum, or gallium, or an n-type impurity element such as phosphorus or arsenic may be added to the semiconductor layer 141. A region to which the impurity element is added and the kind of the impurity element to be added can be changed as appropriate. For example, a p-type impurity element can be added to a region where an n-channel transistor is formed, and an n-type impurity element can be added to a region where a p-channel transistor is formed. The above impurity elements may be added at a dose of approximately equal to or higher than $1\times10^{15}/cm^2$ and equal to or lower than $1\times10^{17}/cm^2$.

Figure 10B:
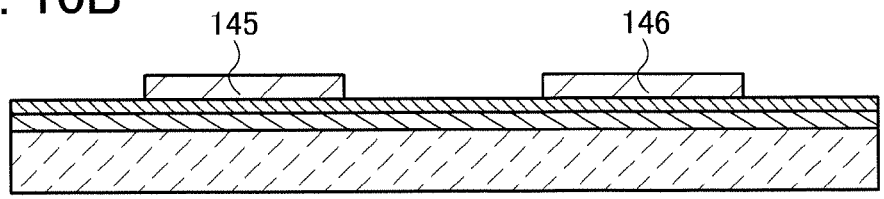

Then, the semiconductor layer 141 is divided into island shapes to form a semiconductor layer 145 and a semiconductor layer 146 (see FIG. 10B). At this time, the region 142 which has surface roughness is removed and the semiconductor layers 145 and 146 are formed with the region 143 with less surface roughness. Thus, an active layer of the semiconductor device can be formed with the semiconductor layers 145 and 146 with less surface roughness. By using the semiconductor layers 145 and 146 with less surface roughness as active layers, reliability of the semiconductor device can be increased.

Figure 10C:
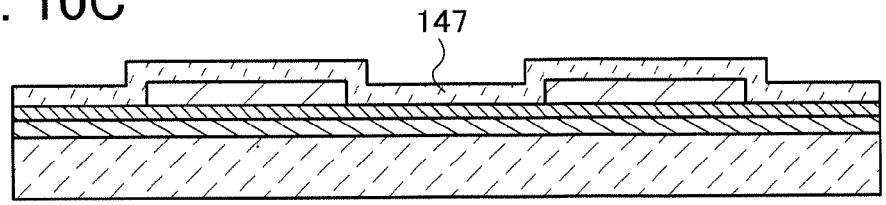

Next, a gate insulating film 147 is formed so as to cover the semiconductor layers 145 and 146 (see FIG. 10C). Here, a single-layer silicon oxide film is formed by a plasma CVD method. Alternatively, a film containing silicon oxynitride, silicon nitride oxide, silicon nitride, hafnium oxide, aluminum oxide, tantalum oxide, or the like may be formed to have a single-layer structure or a layered structure as the gate insulating film 147.

As examples of a manufacturing method other than a plasma CVD method, a sputtering method or a method using oxidation or nitridation by high density plasma treatment can be given. High-density plasma treatment is performed using, for example, a mixed gas of a rare gas such as helium, argon, krypton, or xenon; and a gas such as oxygen, nitrogen oxide, ammonia, nitrogen, or hydrogen. In this case, by exciting plasma by introduction of microwaves, plasma with a low electron temperature and high density can be generated. The surfaces of the semiconductor layers are oxidized or nitrided by oxygen radicals (OH radicals may be included) or nitrogen radicals (NH radicals may be included) which are produced by such high-density plasma, whereby an insulating film is formed to a thickness greater than or equal to 1 nm and less than or equal to 20 nm, preferably greater than or equal to 2 nm and less than or equal to 10 nm so as to be in contact with the semiconductor layers.

Since the oxidation or nitridation of the semiconductor layers through the above high-density plasma treatment is a solid-phase reaction, the interface state density between the gate insulating film 147 and each of the semiconductor layers 145 and 146 can be drastically reduced. Further, the semiconductor layers are directly oxidized or nitrided by the high-density plasma treatment, whereby variation in the thickness of the insulating film to be formed can be suppressed. Since the semiconductor layers are single crystal films, even when the surfaces of the semiconductor layers are oxidized by a solid-phase reaction by using the high-density plasma treatment, a gate insulating film with high uniformity and low interface state density can be formed. When an insulating film formed by the high-density plasma treatment as described above is used for a part or whole of the gate insulating film of a transistor, variation in characteristics can be suppressed.

Alternatively, a gate insulating film may be formed by thermally oxidizing the semiconductor layers 145 and 146. In this case, the gate insulating film is formed over the semiconductor layers 145 and 146. In the case of such thermal oxidation, it is necessary to use a glass substrate having a certain degree of heat resistance.

Note that after a gate insulating film 147 containing hydrogen is formed, hydrogen contained in the gate insulating film 147 may be dispersed into the semiconductor layers 145 and 146 by performing heat treatment at a temperature higher than or equal to 350° C. and lower than or equal to 450° C. In this case, the gate insulating film 147 can be formed using silicon nitride or silicon nitride oxide by a plasma CVD method. Further, a process temperature is preferably set to be equal to or lower than 350° C. Thus, hydrogen is supplied to the semiconductor layers 145 and 146 so that defects in the semiconductor layer 145, the semiconductor layer 146, an interface between the gate insulating film 147 and the semiconductor layer 145, and an interface between the gate insulating film 147 and the semiconductor layer 146 can be reduced effectively.

Figure 10D:
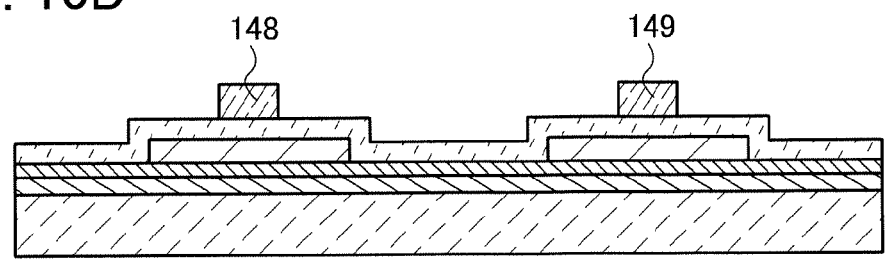

Next, a conductive film is formed over the gate insulating film 147, and then, the conductive film is processed (patterned) into a predetermined shape, whereby an electrode 148 and an electrode 149 are formed over the semiconductor layer 145 and the semiconductor layer 146, respectively (see FIG. 10D). The conductive film can be formed by a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as a main component or a compound containing the above-described metal can also be used. Further alternatively, a semiconductor material, such as polycrystalline silicon which is obtained by doping a semiconductor with an impurity element that imparts a conductivity type, may be used.

Although the electrodes 148 and 149 are formed using a single-layer conductive film in this embodiment, the semiconductor device according to an embodiment of the disclosed invention is not limited to this structure. Each of the electrodes 148 and 149 may be formed by stacking a plurality of conductive films. In the case of a two-layer structure, for example, a molybdenum film, a titanium film, a titanium nitride film, or the like may be used as a lower layer, and an aluminum film or the like may be used as an upper layer. In the case of a three-layer structure, a stacked-layer structure of a molybdenum film, an aluminum film, and a molybdenum film; a stacked-layer structure of a titanium film, an aluminum film, and a titanium film; or the like may be used.

Note that a mask used for forming the electrodes 148 and 149 may be formed using a material such as silicon oxide or silicon nitride oxide. In this case, a step of forming a mask by patterning a silicon oxide film, a silicon nitride oxide film, or the like is additionally needed; however, decrease in film thickness of the mask in etching is smaller than that in the case of using a resist material; thus, the electrodes 148 and 149 with more precise shapes can be formed. Alternatively, the electrodes 148 and 149 may be selectively formed by a droplet discharge method without using a mask. Here, a droplet discharge method refers to a method in which droplets containing a predetermined composition are discharged or ejected to form a predetermined pattern, and includes an ink-jet method and the like in its category.

Alternatively, the electrodes 148 and 149 can be formed by etching the conductive film to have desired tapered shapes by an inductively coupled plasma (ICP) etching method with appropriate adjustment of etching conditions (the amount of electric power applied to a coil-shaped electrode, the amount of electric power applied to an electrode on a substrate side, the temperature of the electrode on the substrate side, or the like). The tapered shape can be adjusted according to the shape of the mask. Note that as an etching gas, a chlorine-based gas such as chlorine, boron chloride, silicon chloride, or carbon tetrachloride, a fluorine-based gas such as carbon tetrafluoride, sulfur fluoride, or nitrogen fluoride, oxygen, or the like can be used as appropriate.

Figure 10E:
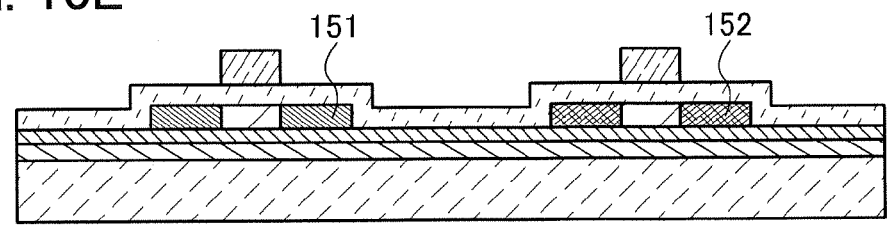

Next, by using the electrodes 148 and 149 as a mask, an impurity element imparting one conductivity type is added to the semiconductor layers 145 and 146 (see FIG. 10E). In this embodiment, an impurity element imparting n-type conductivity (for example, phosphorus or arsenic) is added to the semiconductor layer 145, and an impurity element imparting p-type conductivity (for example, boron) is added to the semiconductor layer 146. Note that when the impurity element imparting n-type conductivity is added to the semiconductor layer 145, the semiconductor layer 146 to which the impurity element imparting p-type conductivity is added is covered with a mask or the like so that the impurity element imparting n-type conductivity is added selectively. When the impurity element imparting p-type conductivity is added to the semiconductor layer 146, the semiconductor layer 145 to which the impurity element imparting n-type conductivity is added is covered with a mask or the like so that the impurity element imparting p-type conductivity is added selectively. Alternatively, after one of the impurity element imparting p-type conductivity and the impurity element imparting n-type conductivity is added to the semiconductor layers 145 and 146, the other of the impurity element imparting p-type conductivity and the impurity element imparting n-type conductivity may be added to only one of the semiconductor layers 145 and 146 at a higher concentration. By the above-described impurity addition, an impurity region 151 is formed in the semiconductor layer 145 and an impurity region 152 is formed in the semiconductor layer 146.

Figure 11A:
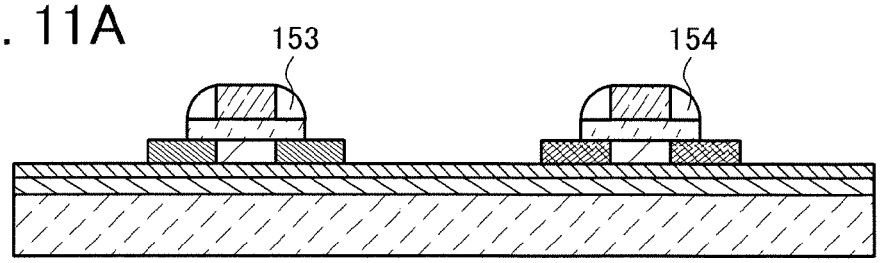
FIGS. 11A to 11D are cross-sectional views of an example of a manufacturing process of a semiconductor device.

Next, sidewalls 153 are formed on side surfaces of the electrode 148, and sidewalls 154 are formed on side surfaces of the electrode 149 (see FIG. 11A). The sidewalk 153 and 154 can be formed by, for example, newly forming an insulating film so as to cover the gate insulating film 147 and the electrodes 148 and 149 and partially etching the newly formed insulating film with anisotropic etching. Note that the gate insulating film 147 may also be etched partially by the anisotropic etching described above. For the insulating film used for forming the sidewalls 153 and 154, a film containing silicon, silicon oxide, silicon nitride, silicon oxynitride, silicon nitride oxide, an organic material, or the like may be formed to have a single layer structure or a stacked-layer structure by a plasma CVD method, a sputtering method, or the like. In this embodiment, a 100-nm-thick silicon oxide film is formed by a plasma CVD method. In addition, as an etching gas, a mixed gas of $CHF_3$ and helium can be used. Note that the steps of forming the sidewalls 153 and 154 are not limited to the steps described here.

Figure 11B:
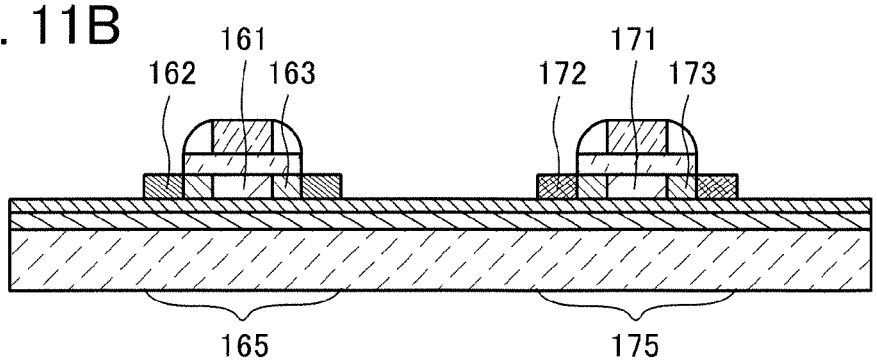

Next, impurity elements each imparting one conductivity type are added to the semiconductor layers 145 and 146 using the gate insulating film 147, the electrodes 148 and 149, and the sidewalls 153 and 154 as masks (see FIG. 11B). Note that in each of the semiconductor layers 145 and 146, an impurity element imparting the same conductivity as that of the impurity element which has been added in the former step is added at a higher concentration. Here, when the impurity element imparting n-type conductivity is added to the semiconductor layer 145, the semiconductor layer 146 to which the impurity element imparting p-type conductivity is added is covered with a mask or the like so that the impurity element imparting n-type conductivity is added selectively. When the impurity element imparting p-type conductivity is added to the semiconductor layer 146, the semiconductor layer 145 to which the impurity element imparting n-type conductivity is added is covered with a mask or the like so that the impurity element imparting p-type conductivity is added selectively.

By the above-described addition of the impurity element, a pair of high-concentration impurity regions 162, a pair of low-concentration impurity regions 163, and a channel formation region 161 are formed in the semiconductor layer 145. In addition, by the above-described addition of the impurity element, a pair of high-concentration impurity regions 172, a pair of low-concentration impurity regions 173, and a channel formation region 171 are formed in the semiconductor layer 146. The high-concentration impurity regions 162 and the high-concentration impurity regions 172 each function as a source or a drain, and the low-concentration impurity regions 163 and the low-concentration impurity regions 173 each function as a lightly doped drain (LDD) region.

Note that the sidewalls 153 formed over the semiconductor layer 145 and the sidewalls 154 formed over the semiconductor layer 146 may be formed so as to have the same length or different lengths in a direction in which carriers move (in a direction parallel to a so-called channel length). For example, the sidewalls 154 over the semiconductor layer 146 which constitutes part of a p-channel transistor is preferably formed to have a longer length in the direction in which carriers move than that of the sidewalls 153 over the semiconductor layer 145 which constitutes part of an n-channel transistor. By increasing the lengths of the sidewalls 154 of the p-channel transistor, a short channel effect due to diffusion of boron can be suppressed; therefore, boron can be added to the source and the drain at high concentration. Accordingly, the resistance of the source and the drain can be sufficiently reduced.

In order to further reduce the resistance of the source and the drain, a silicide region may be formed by forming silicide in part of the semiconductor layers 145 and 146. The silicide is formed by placing a metal in contact with the semiconductor layers and allowing the metal and silicon in the semiconductor layers to be reacted by heat treatment (a GRTA method, an LRTA method, or the like). For the silicide region, cobalt silicide, nickel silicide, or the like may be used. In the case of the semiconductor layers 145 and 146 are thin, silicide reaction may proceed to bottoms of the semiconductor layers 145 and 146. As a metal used for the silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide region can also be formed by laser beam irradiation or the like.

Through the above steps, an n-channel transistor 165 and a p-channel transistor 175 are formed. Note that although conductive films each serving as a source electrode or a drain electrode have not been formed at the stage in FIG. 11B, a structure including these conductive films each serving as a source electrode or a drain electrode may also be referred to as a transistor.

Figure 11C:
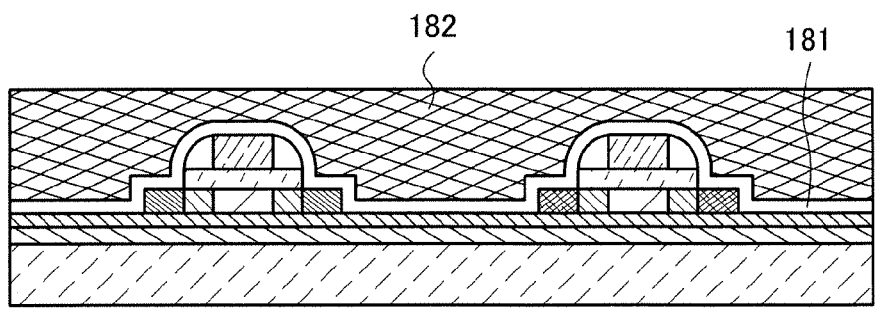

Next, an insulating film 181 is formed to cover the n-channel transistor 165 and the p-channel transistor 175 (see FIG. 11C). The insulating film 181 is not necessarily provided; however, the insulating film 181 can prevent impurities such as an alkali metal and an alkaline earth metal from entering the n-channel transistor 165 and the p-channel transistor 175. Specifically, the insulating film 181 is preferably formed from a material such as silicon oxide, silicon nitride, silicon oxynitride, silicon nitride oxide, aluminum nitride, aluminum oxide, or the like. In this embodiment, a silicon nitride oxide film with a thickness of approximately 600 nm is used as the insulating film 181. In this case, the above-described hydrogenation step may be performed after the silicon nitride oxide film is formed. Note that although the insulating film 181 has a single-layer structure in this embodiment, the insulating film 181 may have a stacked-layer structure. For example, in the case of a two-layer structure, the insulating film 181 can have a stacked-layer structure of a silicon oxynitride film and a silicon nitride oxide film.

Next, an insulating film 182 is formed over the insulating film 181 so as to cover the n-channel transistor 165 and the p-channel transistor 175. The insulating film 182 may be formed from an organic material having heat resistance, such as polyimide, acrylic, benzocyclobutene, polyamide, or epoxy. Other than such an organic material, it is also possible to use a low-dielectric constant material (a low-k material), a siloxane based resin, silicon oxide, silicon nitride, silicon oxynitride, silicon nitride oxide, phosphosilicate glass (PSG), borophosphosilicate glass (BPSG), alumina, or the like. Here, the siloxane-based resin corresponds to a resin including a Si—O—Si bond which is formed using a siloxane-based material as a starting material. The siloxane-based resin may include, besides hydrogen, one of fluorine, an alkyl group, or aromatic hydrocarbon as a substituent. Note that the insulating film 182 can also be formed by stacking a plurality of insulating films formed of such materials.

For the formation of the insulating film 182, the following method can be used depending on the material of the insulating film 182: a CVD method, a sputtering method, an SOG method, a spin coating method, a dip coating method, a spray coating method, a droplet discharge method (e.g., an ink-jet method, screen printing, or offset printing), or a tool (equipment) such as a doctor knife, a roll coater, a curtain coater, or a knife coater.

Next, contact holes are formed in the insulating films 181 and 182 so that each of the semiconductor layers 145 and 146 is partly exposed. Then, a conductive film 183 and a conductive film 184 which are in contact with the semiconductor layer 145 through the contact holes and a conductive film 185 and a conductive film 186 which are in contact with the semiconductor layer 146 through the contact holes are formed (see FIG. 11D). Each of the conductive films 183, 184, 185, and 186 serves as a source electrode or a drain electrode of the transistor. Note that in this embodiment, as an etching gas for forming the contact holes, a mixed gas of $CHF_3$ and He is employed; however, the etching gas is not limited thereto.

The conductive films 183, 184, 185, and 186 can be formed by a CVD method, a sputtering method, or the like. As a material of the conductive films, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described material as its main component or a compound containing the above-described material may be used. Further, each of the conductive films 183, 184, 185, and 186 may have a single-layer structure or a stacked-layer structure.

As an example of an alloy containing aluminum as its main component, an alloy containing aluminum as its main component and also containing nickel can be given. In addition, an alloy containing aluminum as its main component and also containing nickel and one or both of carbon and silicon can be given as an example thereof. Aluminum and aluminum silicon (Al—Si), which have low resistance and are inexpensive, are suitable as a material for forming the conductive films 183, 184, 185, and 186. In particular, the aluminum silicon is preferable because a hillock can be prevented from generating due to resist baking at the time of patterning. Further, a material in which Cu is mixed into aluminum at approximately 0.5% may be used instead of silicon.

In the case where each of the conductive films 183, 184, 185, and 186 is formed to have a stacked-layer structure, a stacked-layer structure of a barrier film, an aluminum silicon film, and a barrier film, a stacked-layer structure of a barrier film, an aluminum silicon film, a titanium nitride film, and a barrier film, or the like may be employed, for example. Note that the barrier film refers to a film formed using titanium, a nitride of titanium, molybdenum, a nitride of molybdenum, or the like. By forming the conductive films such that an aluminum silicon film is interposed between barrier films, generation of hillocks of aluminum or aluminum silicon can be further prevented. When a barrier film is formed of titanium, which is an element having a high reducing property, even if a thin oxide film is formed over the semiconductor layers 145 and 146, the oxide film is reduced by titanium contained in the barrier film; thus, contacts between the each of conductive films 183 and 184 and the semiconductor layer 145, and contacts between the each of conductive films 185 and 186 and the semiconductor layer 146 can be favorable. Further, it is also possible to stack a plurality of barrier films. In that case, for example, each of the conductive films 183, 184, 185, and 186 can be formed to have a five-layer structure of titanium, titanium nitride, aluminum silicon, titanium, and titanium nitride in order from the bottom or a stacked-layer structure of more than five layers.

For the conductive films 183, 184, 185, and 186, tungsten silicide formed by a chemical vapor deposition method using a $WF_6$ gas and a $SiH_4$ gas may be used. Alternatively, tungsten formed by hydrogen reduction of $WF_6$ may be used for the conductive films 183, 184, 185, and 186.

Note that the conductive films 183 and 184 are connected to the high-concentration impurity regions 162 of the n-channel transistor 165. The conductive films 185 and 186 are connected to the high-concentration impurity regions 172 of the p-channel transistor 175.

Figure 11D:
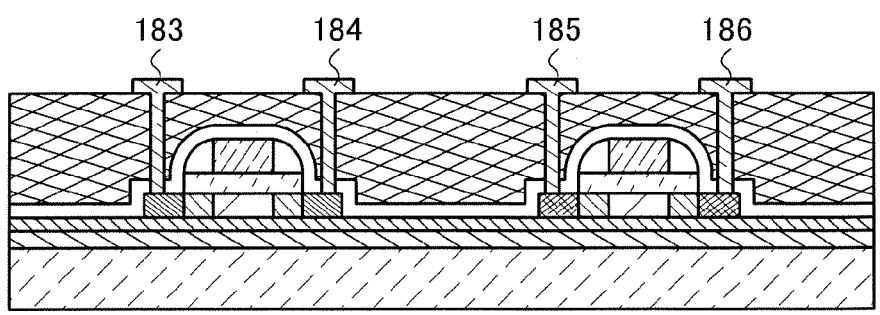
Figure 12:
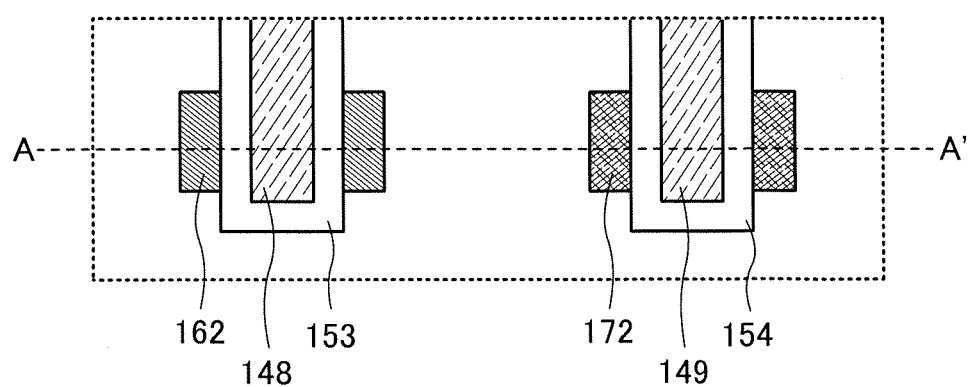
FIG. 12 is a top view of an example of a manufacturing process of a semiconductor device.

FIG. 12 is a top view of the n-channel transistor 165 and the p-channel transistor 175 which are illustrated in FIG. 11D. Here, the cross section taken along the line A-A' in FIG. 12 corresponds to the cross-sectional view of FIG. 11D. Note that in FIG. 12, the insulating film 181, the conductive film 183, the conductive film 184, the conductive film 185, the conductive film 186, and the like are omitted for simplicity.

Note that although the case where the n-channel transistor 165 and the p-channel transistor 175 each include one electrode serving as a gate electrode (the case where the n-channel transistor 165 and the p-channel transistor 175 include the electrodes 148 and 149, respectively) is described in this embodiment as an example, an embodiment of the disclosed invention is not limited to this structure. The transistors may have a multi-gate structure in which a plurality of electrodes serving as gate electrodes are included and electrically connected to one another.

As described in this embodiment, the SOI substrate in which surface roughness of the semiconductor layer is suppressed is used, so that the yield of the semiconductor device can be improved. Note that the structure described in this embodiment can be used in appropriate combination with any of structures described in the other embodiments.

Example

In this example, a manufacturing example of the SOI substrate according to Embodiment 1 will be described.

First, in accordance with Embodiment 1, a single crystal silicon substrate was prepared as the single crystal semiconductor substrate 110 to which hydrogen ions were added at a dose of $2.0 \times 10^{16}$ ions/cm$^2$ to $2.5 \times 10^{16}$ ions/cm$^2$ as the ions 115 so that the embrittlement layer 114 was formed. In addition, a glass substrate was used as the base substrate 100 over which the nitrogen-containing layer 102 was formed. Then, the glass substrate was bonded to the single crystal silicon substrate in which the embrittlement layer 114 was formed. The above embodiments can be referred to for the detailed description thereof.

Figure 7:
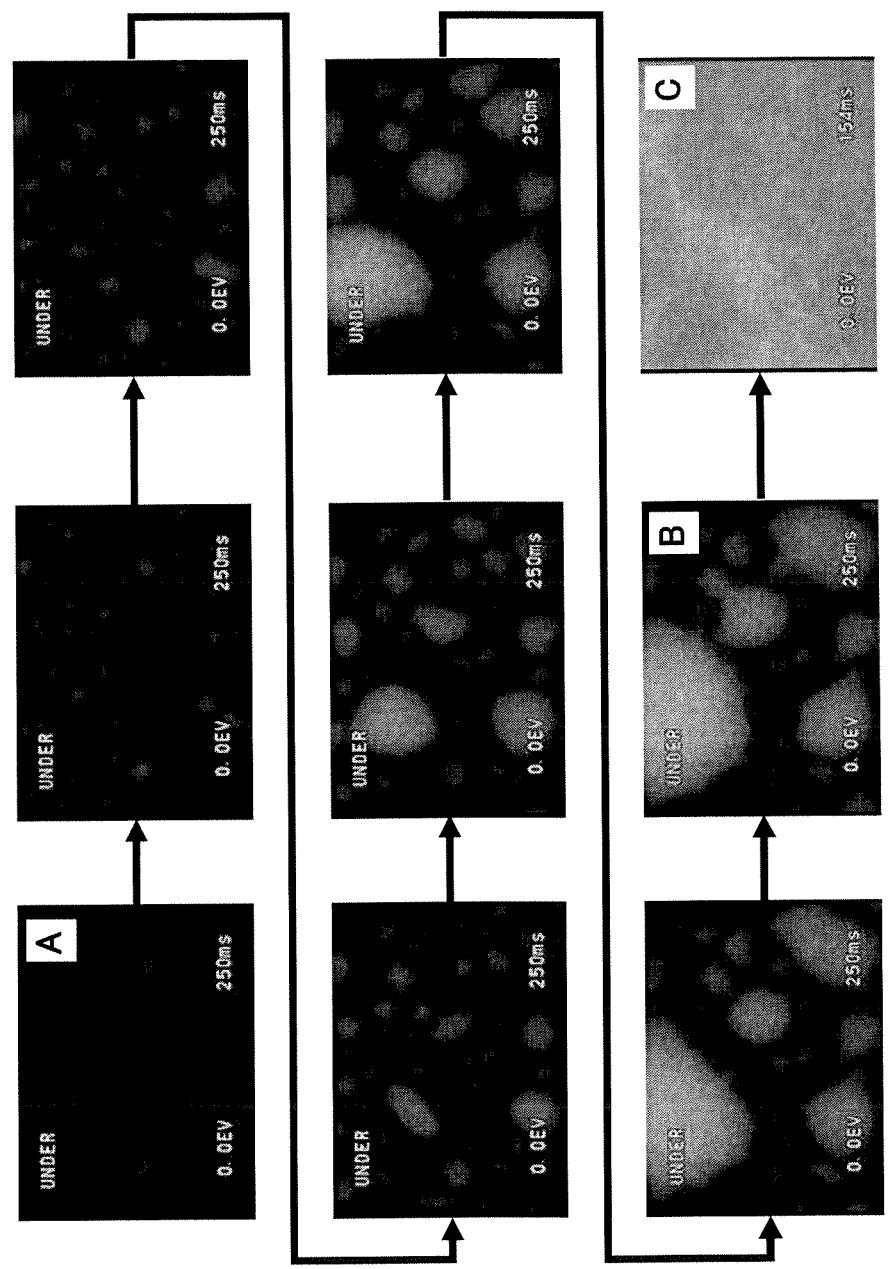
FIG. 7 is images showing growth of hydrogen bubbles.

FIG. 7 is enlarged views (optical micrographs) observed from the glass substrate side, which captured the progress of growth of hydrogen bubbles in the single crystal silicon substrate after the single crystal silicon substrate was bonded to the glass substrate as described above.

Note that, in FIG. 7, a photograph A shows hydrogen bubbles at a temperature in the early stage (temp X) for generation of hydrogen bubbles, and a photograph B shows hydrogen bubbles at a temperature just before separation (temp Y). The temperature (temp Y) was 10° C. to 15° C. higher than the temperature (temp X). Photographs between the photograph A and the photograph B show the progress of growth of hydrogen bubbles.

It is seen from FIG. 7 that hydrogen microbubbles (photograph A) were generated at the temperature (temp X), the size of hydrogen bubbles was increased as the number of the hydrogen bubbles increases, and bubbles beyond a certain size connected to each other to grow to larger hydrogen bubbles (photograph B).

Large hydrogen bubbles in the photograph B were not observed at a temperature lower than the temperature (temp Y) and were observed at the temperature (temp Y) for the first time.

In addition, a photograph C in the FIG. 7 was an enlarged view (optical micrographs) of a surface of the single crystal silicon layer formed over the glass substrate, which was obtained by separating the single crystal silicon layer from the single crystal silicon substrate after the large bubbles were formed at the temperature (temp Y). It is found from the photograph C that shapes of the large bubbles remained. Such a large bubble causes the surface roughness. Accordingly, it was effective to perform separation at a stage when the microbubbles were generated in order to obtain a single crystal silicon layer with less surface roughness.

Therefore, according to the photograph A, the photograph B, the photographs between the photographs A and B, and the photograph C in FIG. 7, in the case where the temperature (temp X) is set as the first temperature in the above embodiments and the temperature (temp Y) is set as the second temperature, although surface roughness remained in a region which triggered the separation, only hydrogen microbubbles were existed in the other region; thus, it was found that surface roughness of the separated single crystal silicon layer is suppressed.

In Embodiment 1, it is described that the region 116 of the single crystal semiconductor substrate 110 is heated at the second temperature. The second temperature is higher than the first temperature which is the heating temperature of the other region 117. In Embodiment 2, it is described that the region 136 of the single crystal semiconductor substrate 110 is locally heated at the second temperature as the second heat treatment.

Figure 6:
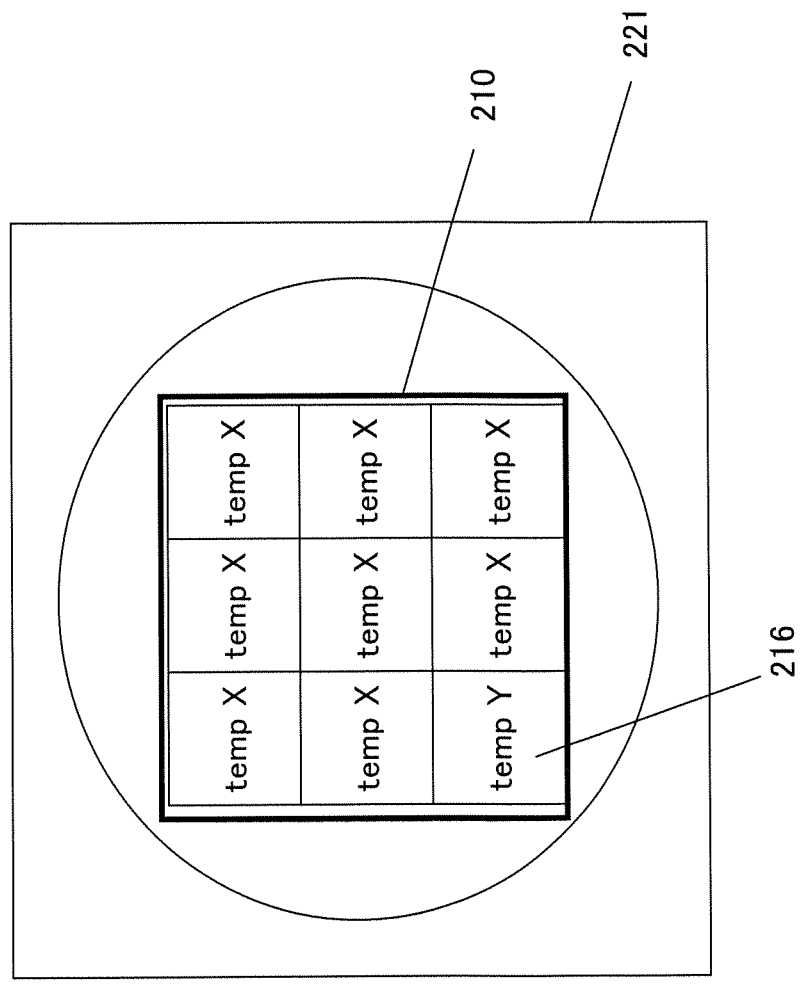
FIG. 6 is a diagram showing a temperature distribution when a single crystal semiconductor substrate is heated unevenly.

In FIG. 6, an example of arrangement of a hot plate 221 capable of varying in-plane temperature distribution depending on the position, a single crystal silicon substrate 210 provided over the hot plate 221, and a region 216 in the single crystal silicon substrate 210 is shown. The region 216 corresponds to the region 116 in Embodiment 1, or the region 136 in Embodiment 2.

In the hot plate 221, the temperature (temp Y) of only the region 216 of the hot plate 221 was set to 10° C. to 30° C. higher, preferably 10° C. to 15° C. higher than the temperature (temp X) of the other region (the region 117 in Embodiment 1 and the region 137 in Embodiment 2). Note that in FIG. 6, the single crystal silicon substrate 210 was divided into 9 regions and a bottom right region is referred to as the region 216.

Note that, as described in Embodiment 1, in the case where the region 216 and the other region are heated at the same time, when the difference in temperature between the temp Y (the temperature of the region 216 and the temp X (the temperature of the other region) is larger than the above difference, hydrogen bubbles in the other region are not grown yet enough to separate the other region when the region 216 is separated. On the other hand, in the case where the temperature difference is smaller than the above difference, hydrogen bubbles in the other region are already grown to a certain size when the region 216 is separated, which weakens effect of suppressing surface roughness of the entire substrate.

Figure 4:
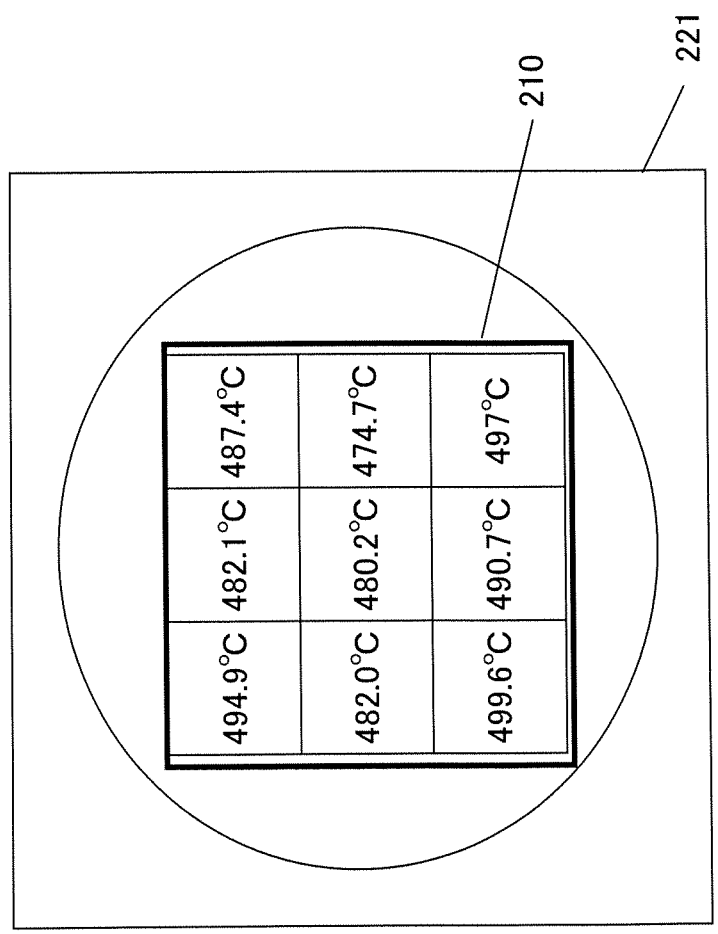
FIG. 4 is a diagram showing a temperature distribution when a single crystal semiconductor substrate is heated unevenly.

An actual temperature distribution when the single crystal silicon substrate 210 was heated unevenly with the hot plate 221 was shown in FIG. 4.

In this example, temperature distribution of the single crystal silicon substrate 210 was measured in 9 regions into which the single crystal silicon substrate 210 was equally decided. As described in FIG. 4, temperature of a bottom left region was highest and the separation often starts from the bottom left region. Alternatively, the separation may starts from a bottom right region which has the second highest temperature.

Figure 5:
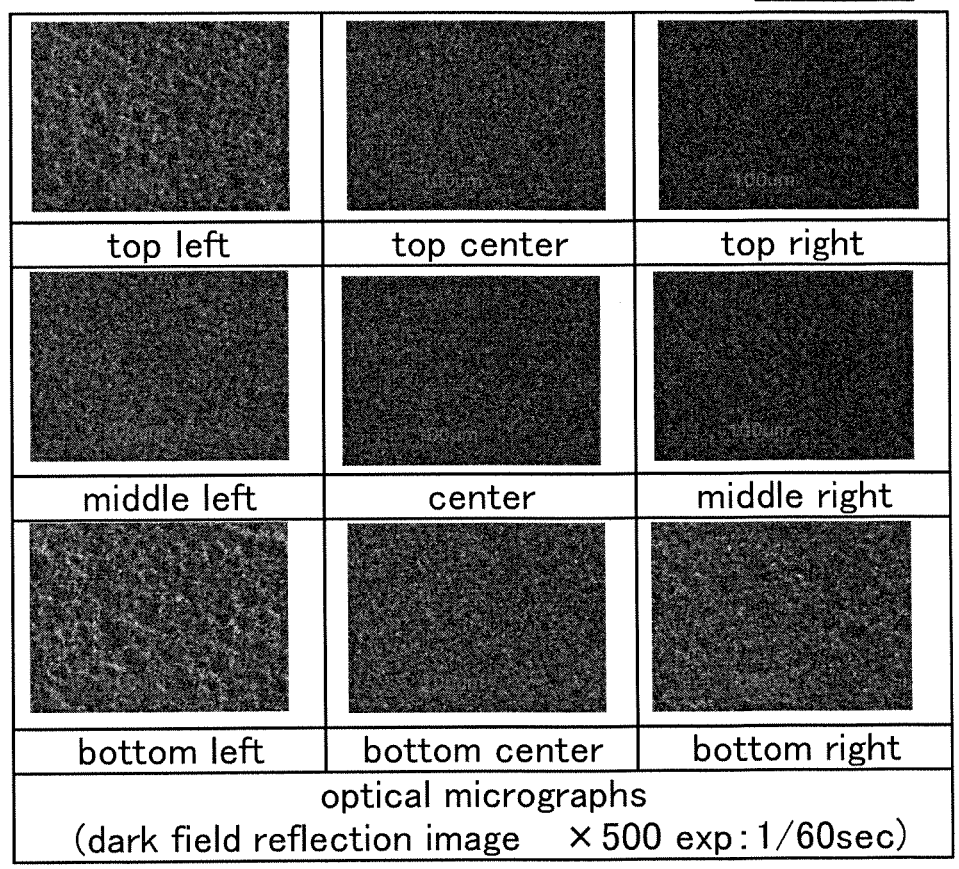
FIG. 5 is images showing a surface of a silicon layer.

FIG. 5 is enlarged views (optical micrographs) of the single crystal silicon layer observed from the glass substrate side after the single crystal silicon layer was separated from the single crystal silicon substrate with the hot plate 221. Note that also in FIG. 5, temperature of the bottom left region is the highest.

It was observed from FIG. 5 (optical micrographs) that, for example, the middle right region has less surface roughness than the bottom left region. One embodiment of the disclosed invention is extremely effective in that such a region with less roughness can be obtained.

Figure 13:
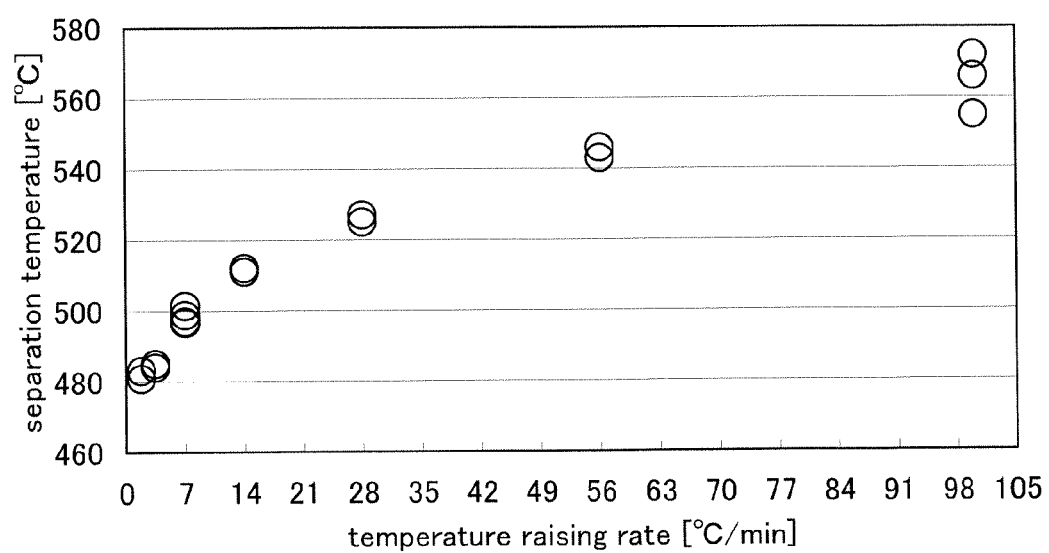
FIG. 13 is a graph showing a relation between a temperature rising rate and separation temperature.

In FIG. 13, relation between temperature raising rate and separation temperature when the dose of hydrogen was $2.0 \times 10^{16}$ ions/cm$^2$ was shown. Note that measurement was performed 2 to 3 times at the same temperature raising rate; thus, the number of circles denoted at the same temperature rinsing rate in FIG. 13 corresponds to the number of measurements.

It was seen from FIG. 13 that as the temperature raising rate is increased, the separation temperature is increased. Note that it was found that the difference between the temperature at which hydrogen bubbles start to grow and the separation temperature is 10° C. to 15° C. regardless of the temperature raising rate; therefore, the separation temperature appropriate to the temperature raising rate may be determined. In addition, it was found that the difference between the temperature at which the hydrogen bubbles start to grow and the separation temperature is 10° C. to 15° C. regardless of the temperature raising rate in a range of the dose of hydrogen between $2.0 \times 10^{16}$ ions/cm$^2$ to $3.0 \times 10^{16}$ ions/cm$^2$.

Further, hydrogen ions were added to the single crystal silicon substrate at a dose of $2.0 \times 10^{16}$ ions/cm$^2$ to $2.5 \times 10^{16}$ ions/cm$^2$ so that the embrittlement layer was formed. Then, the single crystal silicon substrate was bonded to the glass substrate over which the nitrogen-containing layer was formed. From that, Sample X obtained by separating the single crystal silicon layer at the temperature (temp X) and Sample Y obtained by separating the single crystal silicon layer at the temperature (temp Y) which was 10° C. to 15° C. higher than the temperature (temp X) (that is, temp Y−temp X=10-15° C.) were prepared. Observation images of the Sample X and the Sample Y which were observed with an atomic force microscope (AFM) were shown in FIGS. 14 and 15, respectively.

Figure 14:
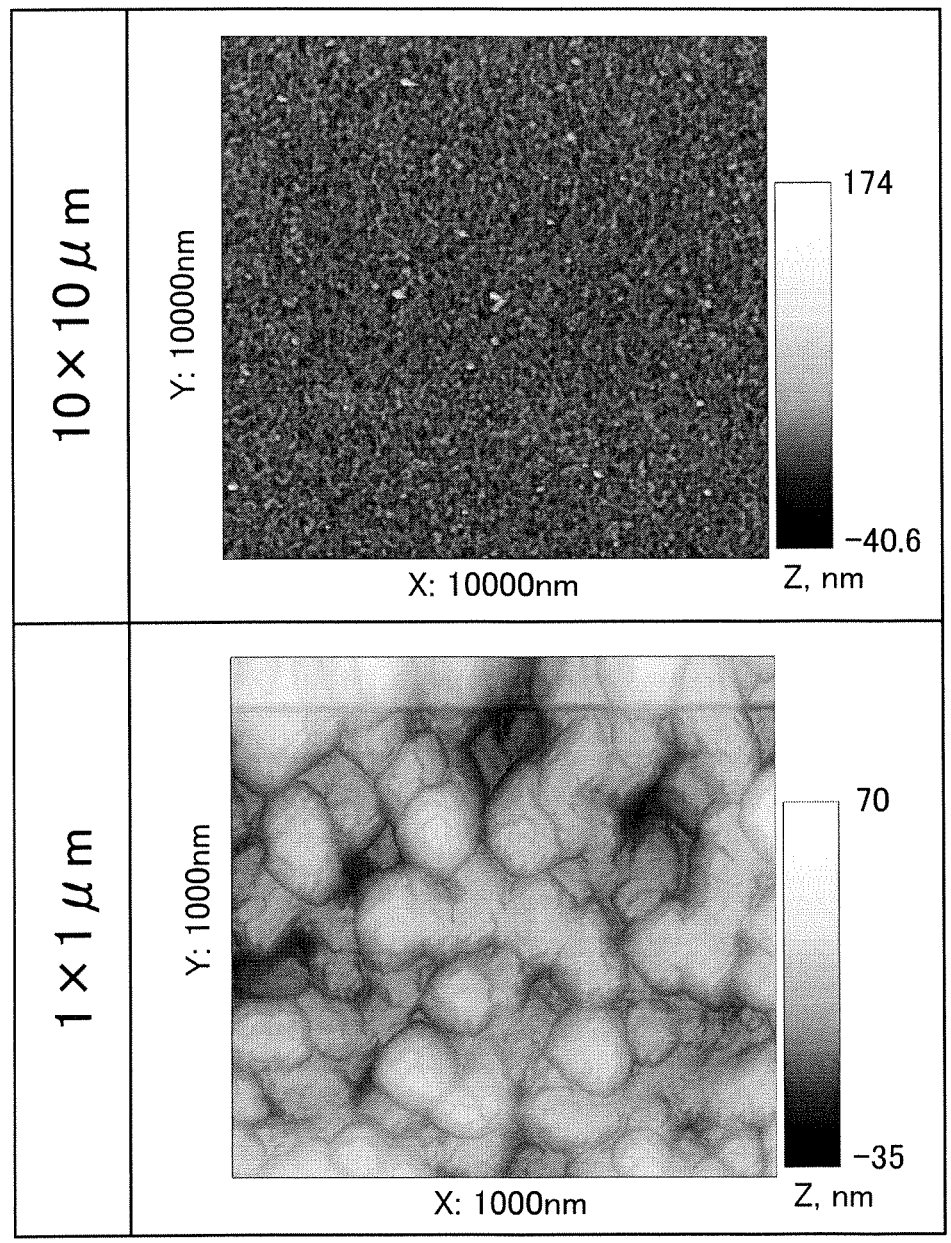
FIG. 14 is images observed by AFM.

FIG. 14 is AFM images of the Sample X: the upper image shows a region with an area of 10 μm×10 μm; the lower image shows an enlarged view of the region with an area of 1 μm×1 μm. Similarly, FIG. 15 is AFM images of the Sample Y: the upper image shows a region with an area of 10 μm×10 μm; the lower image shows an enlarged view of the region with an area of 1 μm×1 μm.

Figure 15:
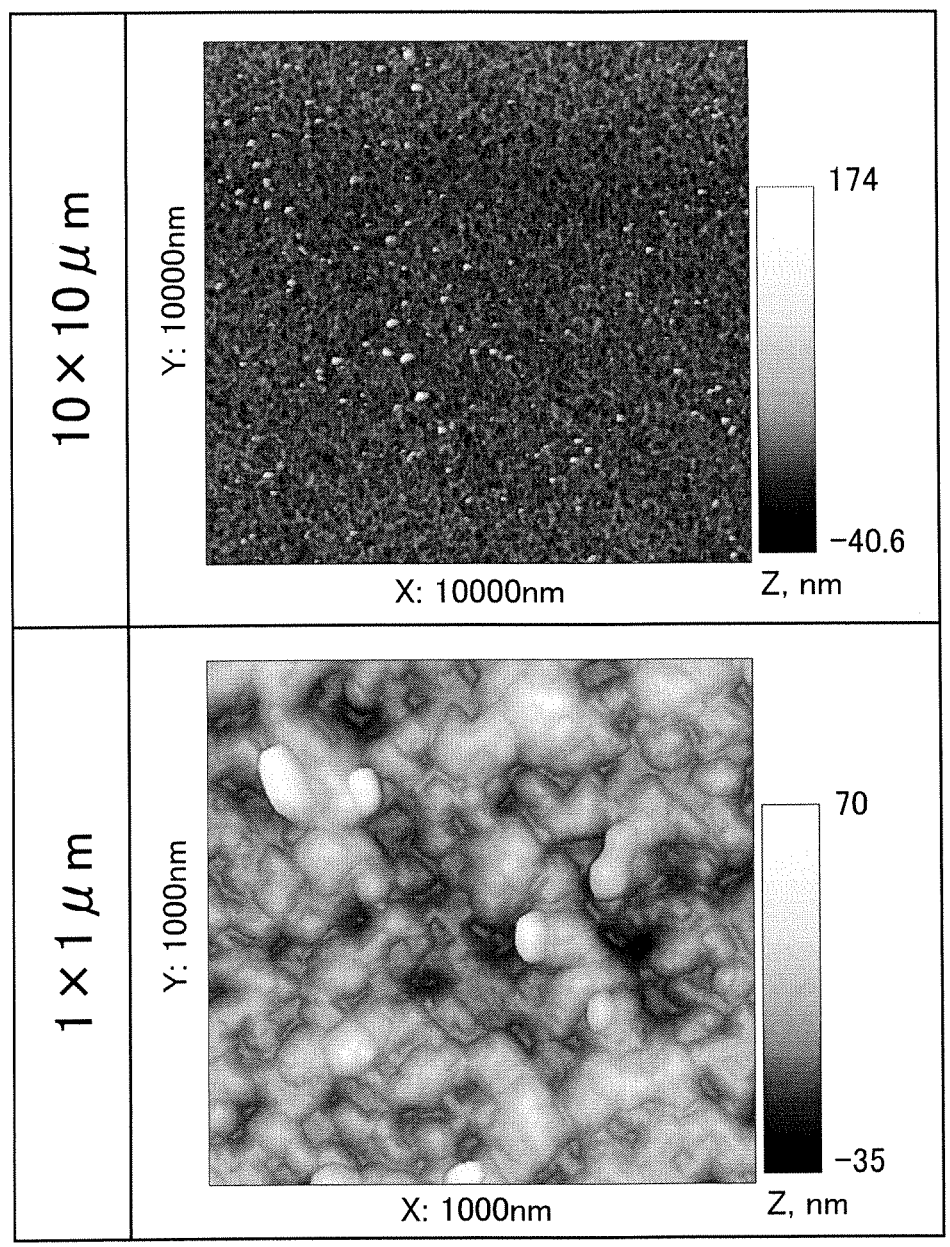
FIG. 15 is images observed by AFM.

Comparing FIG. 14 to FIG. 15, it was found that the Sample Y (see FIG. 15) included more regions in which difference in height of the surface roughness was large than the Sample X. That is, more surface roughness was generated in the Sample Y than the Sample X. On the other hand, it was found that the Sample X (see FIG. 14) included fewer regions in which difference in height of the surface roughness was large and included more even surface than the Sample Y.

Figure 16:
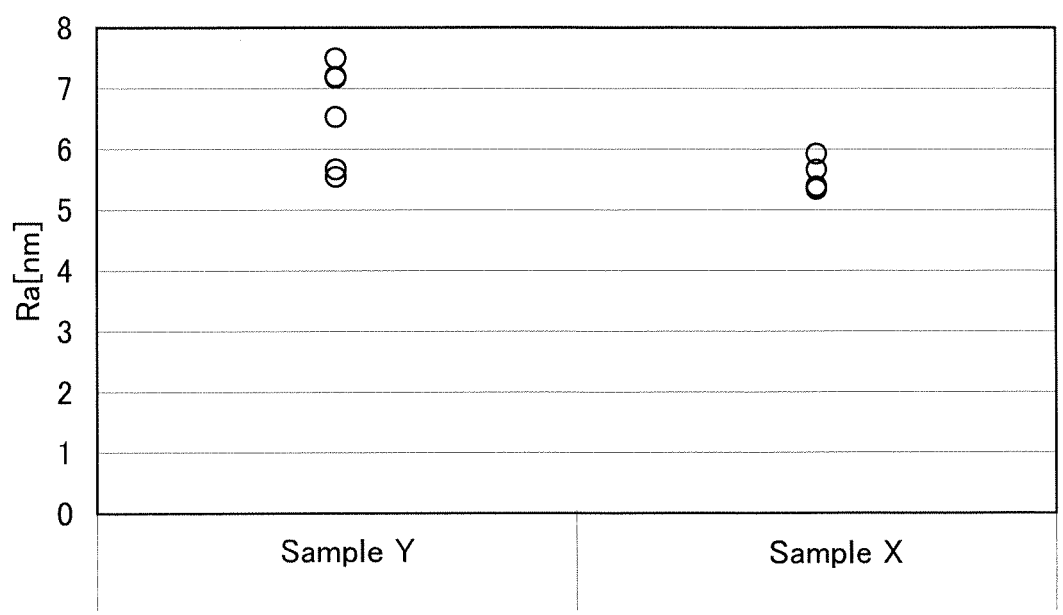
FIG. 16 is a graph showing the result of comparing an average surface roughness (Ra)
Figure 17:
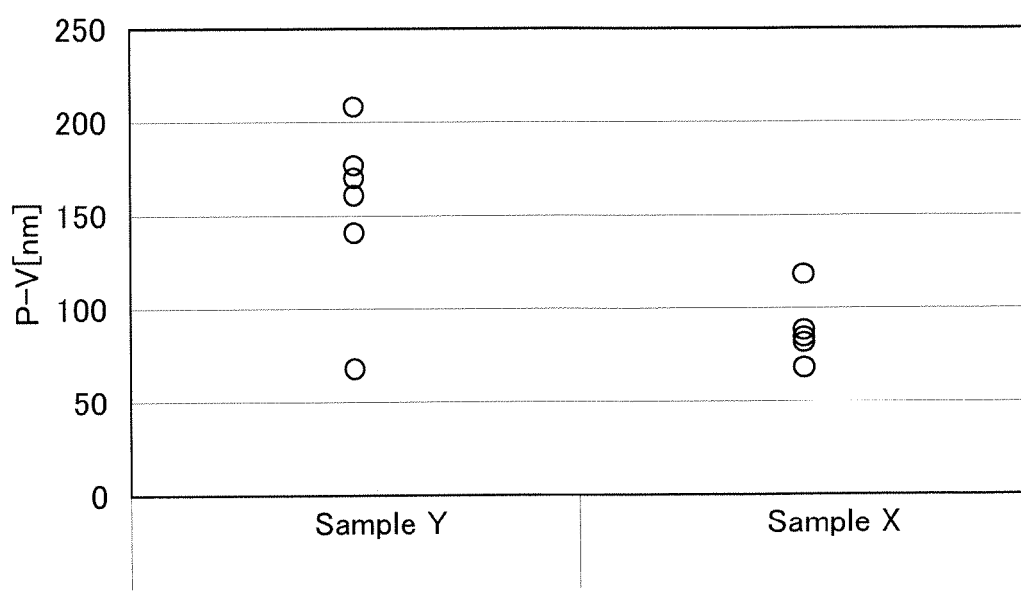
FIG. 17 is a graph showing the result of comparing the maximum peak-to-valley height (P-V)
Figure 18:
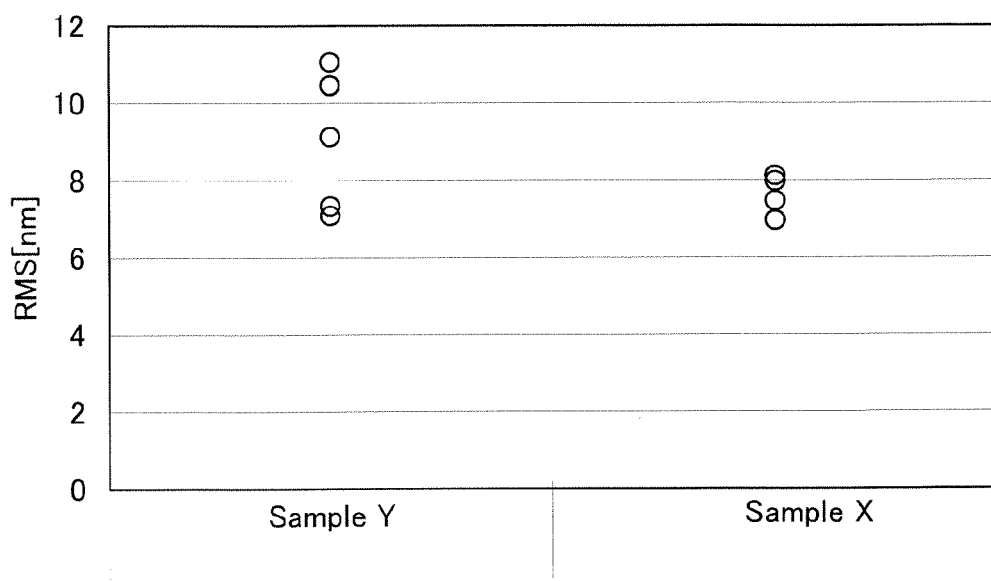
FIG. 18 is a graph showing the result of comparing a root-mean-square surface roughness (RMS).

In FIGS. 16, 17, and 18, average surface roughness (Ra), the maximum peak-to-valley height (P-V), and root-mean-square surface roughness (RMS) of each of the Sample X and the Sample Y are shown respectively, which were calculated based on the AFM images in the measurement region with an area of 10 μm×10 μm. In each of FIGS. 16, 17, and 18, the number of circles is corresponded to the number of measurements (the number of samples).

In FIG. 16, it is found that in the Sample Y, samples having larger Ra than samples of the Sample X exist. In addition, it is found that samples having Ra larger than 7.0 nm exist in the Sample Y, while samples having Ra smaller than or equal to 6.0 nm exist in the Sample X.

In FIG. 17, it is found that in the Sample Y, samples having larger P-V than samples of the Sample X exist. In addition, it is found that samples having P-V larger than 150 nm, further larger than 200 nm exist in the Sample Y, while samples having P-V smaller than or equal to 150 nm exist in the Sample X.

In FIG. 18, it is found that in the Sample Y, samples having larger RMS than samples of the Sample X exist. In addition, it is found that samples having RMS larger than 10 nm exist in the Sample Y, while samples having RMS smaller than or equal to 10 nm exist in the Sample X.

As described above, this example revealed effectiveness of an embodiment of the disclosed invention. According to one embodiment of the disclosed invention, surface roughness of the semiconductor layer can be suppressed sufficiently, which is effective to provide an SOI substrate having a favorable surface and a semiconductor device manufactured with such an SOI substrate.

This application is based on Japanese Patent Application serial no. 2010-021857 with Japan Patent Office on Feb. 3, 2010, the entire contents of which are hereby incorporated by reference.

What is claimed is:

1. A method for manufacturing an SOI substrate, comprising the steps of:
    irradiating a semiconductor substrate with ions to form an embrittlement layer in the semiconductor substrate;
    bonding the semiconductor substrate to a base substrate; and,
    heating a first region of the semiconductor substrate at a first temperature and heating a second region of the semiconductor substrate at a second temperature lower than the first temperature to form a semiconductor layer over the base substrate by causing separation at the embrittlement layer,
    wherein the first region is located at an end portion of the semiconductor substrate,
    wherein during the heating step, bubble growth is caused in the embrittlement layer, and
    wherein the bubble growth in the first region of the semiconductor substrate proceeds faster than the bubble growth in the second region of the semiconductor substrate and thereby the separation proceeds from the first region of the semiconductor substrate to the second region of the semiconductor substrate.

2. The method for manufacturing an SOI substrate according to claim 1, wherein the first temperature is higher by 10° C. or more and 30° C. or less than the second temperature.

3. The method for manufacturing an SOI substrate according to claim 1, wherein the first temperature is higher by 10° C. or more and 15° C. or less than the second temperature.

4. The method for manufacturing an SOI substrate according to claim 1, further comprising the step of forming an insulating layer over at least one of the semiconductor substrate or the base substrate before bonding the semiconductor substrate to the base substrate.

5. The method for manufacturing an SOI substrate according to claim 1, further comprising the step of removing a region of the semiconductor layer corresponding to the first region of the semiconductor substrate.

6. The method for manufacturing an SOI substrate according to claim 1, wherein the ions including hydrogen ions.

7. A method for manufacturing an SOI substrate, comprising the steps of:

irradiating a semiconductor substrate with ions to form an embrittlement layer in the semiconductor substrate;

bonding the semiconductor substrate to a base substrate;

performing a first heat treatment on the semiconductor substrate at a first temperature; and, performing a second heat treatment on one region which is a part of the semiconductor substrate at a second temperature higher than the first temperature to form a semiconductor layer over the base substrate by causing separation at the embrittlement layer, wherein the separation proceeds from the one region of the semiconductor substrate to the other region of the semiconductor substrate.

8. The method for manufacturing an SOI substrate according to claim 7, wherein the second temperature is higher by 10° C. or more than the first temperature.

9. The method for manufacturing an SOI substrate according to claim 7, further comprising the steps of forming an insulating layer over at least one of the semiconductor substrate or the base substrate before bonding the semiconductor substrate to the base substrate.

10. The method for manufacturing an SOI substrate according to claim 7, further comprising the step of removing a region of the semiconductor layer corresponding to the one region of the semiconductor substrate.

11. The method for manufacturing an SOI substrate according to claim 7, wherein the ions including hydrogen ions.

12. A method for manufacturing a semiconductor device, comprising the steps of:

irradiating a semiconductor substrate with ions to form an embrittlement layer in the semiconductor substrate;

bonding the semiconductor substrate to a base substrate; and, heating a first region of the semiconductor substrate at a first temperature and a second region of the semiconductor substrate at a second temperature lower than the first temperature to form a first semiconductor layer over the base substrate by causing separation at the embrittlement layer;

removing a region of the first semiconductor layer corresponding to the first region of the semiconductor substrate to form a second semiconductor layer; and forming a semiconductor element with the second semiconductor layer, wherein the separation proceeds from the first region of the semiconductor substrate to the second region of the semiconductor substrate.

13. The method for manufacturing a semiconductor device according to claim 12, wherein the first temperature is higher by 10° C. or more and 30° C. or less than the second temperature.

14. The method for manufacturing a semiconductor device according to claim 12, wherein the first temperature is higher by 10° C. or more and 15° C. or less than the second temperature.

15. The method for manufacturing a semiconductor device according to claim 12, further comprising the step of forming an insulating layer over at least one of the semiconductor substrate or the base substrate before bonding the semiconductor substrate to the base substrate.

16. The method for manufacturing a semiconductor device according to claim 12, wherein an average surface roughness of a surface of the second semiconductor layer is less than or equal to 6.0 nm.

17. The method for manufacturing a semiconductor device according to claim 12, wherein the maximum peak-to-valley height of a surface of the second semiconductor layer is less than or equal to 150 nm.

18. The method for manufacturing a semiconductor device according to claim 12, wherein a root-mean-square surface roughness of a surface of the second semiconductor layer is less than or equal to 10 nm.

19. The method for manufacturing a semiconductor device according to claim 12, wherein the ions including hydrogen ions.

20. A method for manufacturing a semiconductor device, comprising the steps of:

irradiating a semiconductor substrate with ions to form an embrittlement layer in the semiconductor substrate;

bonding the semiconductor substrate to a base substrate;

performing a first heat treatment on the semiconductor substrate at a first temperature;

performing a second heat treatment on one region which is a part of the semiconductor substrate at a second temperature higher than the first temperature to form a first semiconductor layer over the base substrate by causing separation at the embrittlement layer;

removing a region of the first semiconductor layer corresponding to the one region of the semiconductor substrate to form a second semiconductor layer; and forming a semiconductor element with the second semiconductor layer, wherein the separation proceeds from the one region of the semiconductor substrate to the other region of the semiconductor substrate.

21. The method for manufacturing a semiconductor device according to claim 20, wherein the second temperature is higher by 10° C. or more than the first temperature.

22. The method for manufacturing a semiconductor device according to claim 20, further comprising the step of forming an insulating layer over at least one of the semiconductor substrate or the base substrate before bonding the semiconductor substrate to the base substrate.

23. The method for manufacturing a semiconductor device according to claim 20, wherein an average surface roughness of a surface of the second semiconductor layer is less than or equal to 6.0 nm.

24. The method for manufacturing a semiconductor device according to claim 20, wherein the maximum peak-to-valley height of a surface of the second semiconductor layer is less than or equal to 150 nm.

25. The method for manufacturing a semiconductor device according to claim 20, wherein a root-mean-square surface roughness of a surface of the second semiconductor layer is less than or equal to 10 nm.

26. The method for manufacturing a semiconductor device according to claim 20, wherein the ions including hydrogen ions.

27. The method for manufacturing an SOI substrate according to claim 1, wherein an average surface roughness of a surface of a region of the semiconductor layer corresponding to the second region of the semiconductor substrate is less than or equal to 6.0 nm.

28. The method for manufacturing an SOI substrate according to claim 1, wherein the maximum peak-to-valley height of a surface of a region of the semiconductor layer corresponding to the second region of the semiconductor substrate is less than or equal to 150 nm.

29. The method for manufacturing an SOI substrate according to claim 1, wherein a root-mean-square surface roughness of a surface of a region of the semiconductor layer corresponding to the second region of the semiconductor substrate is less than or equal to 10 nm.

30. The method for manufacturing an SOI substrate according to claim 7, wherein an average surface roughness of a region of the semiconductor layer corresponding to the other region of the semiconductor substrate is less than or equal to 6.0 nm.

31. The method for manufacturing an SOI substrate according to claim 7, wherein the maximum peak-to-valley height of a surface of a region of the semiconductor layer corresponding to the other region of the semiconductor substrate is less than or equal to 150 nm.

32. The method for manufacturing an SOI substrate according to claim 7, wherein a root-mean-square surface roughness of a surface of a region of the semiconductor layer corresponding to the other region of the semiconductor substrate is less than or equal to 10 nm.

* * * * *